United States Patent
Tian et al.

(10) Patent No.: US 10,566,827 B2
(45) Date of Patent: Feb. 18, 2020

(54) ADAPTER AND CHARGING CONTROL METHOD

(71) Applicant: GUANGDONG OPPO MOBILE TELECOMMUNICATIONS CORP., LTD., Dongguan (CN)

(72) Inventors: Chen Tian, Dongguan (CN); Jialiang Zhang, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/561,880

(22) PCT Filed: Jan. 7, 2017

(86) PCT No.: PCT/CN2017/070527
§ 371 (c)(1),
(2) Date: Sep. 26, 2017

(87) PCT Pub. No.: WO2017/133387
PCT Pub. Date: Aug. 10, 2017

(65) Prior Publication Data
US 2018/0331560 A1    Nov. 15, 2018

Related U.S. Application Data

(63) Continuation-in-part of application No. PCT/CN2016/073679, filed on Feb. 5, 2016.

(30) Foreign Application Priority Data

Jul. 26, 2016    (CN) .......................... 2016 1 0600612

(51) Int. Cl.
*H02J 7/00*        (2006.01)
*H02J 7/02*        (2016.01)
(Continued)

(52) U.S. Cl.
CPC .......... *H02J 7/027* (2013.01); *G01R 31/3842* (2019.01); *H01M 10/0525* (2013.01);
(Continued)

(58) Field of Classification Search
CPC ............... H02J 7/027; H02J 2007/0039; H02J 2007/0059; H02J 2007/0062;
(Continued)

(56) References Cited

U.S. PATENT DOCUMENTS 4,087,733 A    5/1978 Casagrande
5,442,274 A    8/1995 Tamai
(Continued)

FOREIGN PATENT DOCUMENTS

CN    202026118 U    11/2011
CN    102364848 A    2/2012
(Continued)

OTHER PUBLICATIONS

European Patent Application No. 17746707.3 extended Search and Opinion dated Mar. 7, 2018, 17 pages.
(Continued)

*Primary Examiner* — Richard Isla
*Assistant Examiner* — Michael N Dibenedetto
(74) *Attorney, Agent, or Firm* — Lathrop Gage LLP

(57) ABSTRACT

Disclosed are an adapter and a charging control method. The adapter includes a power conversion unit, a sampling and holding unit, and a current collecting and controlling unit. The power conversion unit is configured to convert input alternating current to obtain output voltage and output current, in which the output current is first current with first pulsating waveform. The sampling and holding unit is configured to sample the first current when the sampling and holding unit is in a sampling state, and to hold a peak value of the first current when the sampling and holding unit is in
(Continued)

a holding state. The current collecting and controlling unit is configured to determine whether the sampling and holding unit is in the holding state, and to collect the peak value of the first current when the sampling and holding unit is in the holding state.

16 Claims, 14 Drawing Sheets

(51) Int. Cl.
| | |
|---|---|
| G01R 31/3842 | (2019.01) |
| H02M 3/335 | (2006.01) |
| H02J 7/04 | (2006.01) |
| H02M 7/217 | (2006.01) |
| H02J 7/06 | (2006.01) |
| H02M 1/08 | (2006.01) |
| H02M 7/06 | (2006.01) |
| H01M 10/0525 | (2010.01) |
| H01M 10/42 | (2006.01) |
| H01M 10/44 | (2006.01) |
| H02M 1/44 | (2007.01) |
| H02M 5/04 | (2006.01) |
| H02M 7/04 | (2006.01) |
| H02M 1/00 | (2006.01) |
| H02J 7/10 | (2006.01) |

(52) U.S. Cl.
CPC ......... *H01M 10/425* (2013.01); *H01M 10/44* (2013.01); *H02J 7/007* (2013.01); *H02J 7/008* (2013.01); *H02J 7/0029* (2013.01); *H02J 7/0031* (2013.01); *H02J 7/0052* (2013.01); *H02J 7/0093* (2013.01); *H02J 7/022* (2013.01); *H02J 7/04* (2013.01); *H02J 7/041* (2013.01); *H02J 7/045* (2013.01); *H02J 7/047* (2013.01); *H02J 7/06* (2013.01); *H02M 1/08* (2013.01); *H02M 1/44* (2013.01); *H02M 3/335* (2013.01); *H02M 3/33507* (2013.01); *H02M 3/33523* (2013.01); *H02M 3/33569* (2013.01); *H02M 3/33576* (2013.01); *H02M 3/33592* (2013.01); *H02M 5/04* (2013.01); *H02M 7/04* (2013.01); *H02M 7/06* (2013.01); *H02M 7/217* (2013.01); *H01M 2010/4271* (2013.01); *H02J 2007/0039* (2013.01); *H02J 2007/0059* (2013.01); *H02J 2007/0062* (2013.01); *H02J 2007/0096* (2013.01); *H02J 2007/0098* (2013.01); *H02J 2007/10* (2013.01); *H02M 2001/0009* (2013.01)

(58) Field of Classification Search
CPC ...... H02J 2007/0096; H02J 2007/0098; G01R 31/3842; H02M 1/08–0845; H02M 3/335–33592; H02M 5/04; H02M 7/04; H02M 7/06; H02M 7/217
USPC ........................................................ 320/145
See application file for complete search history.

(56) References Cited

U.S. PATENT DOCUMENTS

| | | | |
|---|---|---|---|
| 6,025,695 | A | 2/2000 | Friel et al. |
| 6,075,340 | A | 6/2000 | Koenck |
| 6,137,265 | A | 10/2000 | Cummings et al. |
| 6,909,617 | B1 | 6/2005 | Mirskiy |
| 2004/0090209 | A1 | 5/2004 | Nishida et al. |
| 2006/0284595 | A1 | 12/2006 | Hsieh et al. |
| 2008/0197811 | A1 | 8/2008 | Hartular |
| 2010/0013686 | A1 | 1/2010 | Tsuchi |
| 2010/0231174 | A1* | 9/2010 | Li .............................. H02J 7/022 320/145 |
| 2012/0281438 | A1* | 11/2012 | Fang .................. H02M 3/33507 363/21.12 |
| 2013/0141034 | A1 | 6/2013 | Huang et al. |
| 2013/0225082 | A1* | 8/2013 | Kang ....................... H02J 7/025 455/41.2 |
| 2014/0225622 | A1* | 8/2014 | Kudo ...................... B60L 3/0046 324/433 |
| 2016/0084894 | A1* | 3/2016 | Govindaraj ............ G01R 25/00 307/104 |
| 2016/0226371 | A1* | 8/2016 | Tsou ........................ H02M 1/32 |
| 2017/0187215 | A1 | 6/2017 | Noda et al. |

FOREIGN PATENT DOCUMENTS

| | | |
|---|---|---|
| CN | 102545360 A | 7/2012 |
| CN | 102916595 A | 2/2013 |
| CN | 102364856 B | 10/2013 |
| CN | 103762702 A | 4/2014 |
| CN | 103795040 A | 5/2014 |
| CN | 203981764 U | 12/2014 |
| CN | 104810877 A | 7/2015 |
| CN | 104810879 A | 7/2015 |
| CN | 104917271 A | 9/2015 |
| CN | 104967199 A | 10/2015 |
| CN | 104967201 A | 10/2015 |
| CN | 104993562 A | 10/2015 |
| CN | 105305551 A | 2/2016 |
| CN | 105472827 A | 4/2016 |
| CN | 106026327 A | 10/2016 |
| CN | 106253428 A | 12/2016 |
| CN | 106297726 A | 1/2017 |
| EP | 2693599 A1 | 2/2014 |
| EP | 2887492 A2 | 6/2015 |
| EP | 2930589 A1 | 10/2015 |
| EP | 2980958 A1 | 2/2016 |
| JP | H0549182 A | 2/1993 |
| JP | H06165407 A | 6/1994 |
| JP | H11143591 A | 5/1999 |
| JP | 2001178013 A | 6/2001 |
| JP | 2010028379 A | 2/2010 |
| JP | 2010288403 A | 12/2010 |
| JP | 2013198262 A | 9/2013 |
| JP | 5454781 B2 | 3/2014 |
| JP | 5822304 B2 | 11/2015 |
| TW | 200616305 A | 5/2006 |
| TW | M481439 U | 7/2014 |
| WO | WO 2012167677 A1 | 12/2012 |
| WO | WO 2015113341 A1 | 8/2015 |
| WO | WO 2015113349 A1 | 8/2015 |

OTHER PUBLICATIONS

Japanese Patent Application No. 2017557434 Office Action dated Apr. 24, 2018, 2 pages.
Japanese Patent Application No. 2017557434 English translation of Office Action dated Apr. 24, 2018, 3 pages.
Australian Patent Application No. 2016291545 Office Action dated Jun. 25, 2018, 6 pages.
European Patent Application No. 16819788.7 extended Search and Opinion dated Nov. 15, 2017, 7 pages.
Korean Patent Application No. 20177002310 Office Action dated Jan. 29, 2018, 5 pages.
Korean Patent Application No. 20177002310 English translation of Office Action dated Jan. 29, 2018, 3 pages.
Korean Patent Application No. 20177002310 Office Action dated Jun. 26, 2018, 3 pages.
Korean Patent Application No. 20177002310 English translation of Office Action dated Jun. 26, 2018, 3 pages.
Singapore Patent Application No. 11201700428U Search and Opinion dated Nov. 23, 2017, 9 pages.
Taiwan Patent Application No. 105120040 Office Action dated Aug. 8, 2017, 11 pages.
Taiwan Patent Application No. 105120040 Decision to Grant Patent dated Mar. 22, 2018, 2 pages.

(56) References Cited

OTHER PUBLICATIONS

PCT/CN2016/073679 International Search Report and Written Opinion dated Nov. 10, 2016, 12 pages.
PCT/CN2016/073679 English translation of International Search Report and Written Opinion dated Nov. 10, 2016, 8 pages.
Chen, Liang-Rui, 'A Design of an Optimal Battery Pulse Charge System by Frequency-Varied Technique', IEEE Transactions on Industrial Electronics, vol. 54, No. 1, Feb. 2007, pp. 398-405, cited in office action in AU application No. 2016291545.
Australian Patent Application No. 2017215241 Office Action dated Jun. 12, 2018, 5 pages.
European Patent Application No. 17746707.3 extended Search and Opinion dated Jun. 27, 2018, 16 pages.
Taiwan Patent Application No. 106124403 Office Action dated Oct. 24, 2018, 5 pages.
PCT/CN2017/070527 English translation of International Search Report dated Apr. 13, 2017, 3 pages.
PCT/CN2017/070527 International Search Report and Written Opinion dated Apr. 13, 2017, 13 pages.
Australian Patent Application No. 2017215241 Office Action dated Oct. 30, 2018, 3 pages.
European Patent Application No. 17746707.3 Office Action dated Jun. 11, 2019, 6 pages.

* cited by examiner

ADAPTER AND CHARGING CONTROL METHOD

CROSS-REFERENCE TO RELATED APPLICATIONS

This application is a US national phase application based upon International Application No. PCT/CN2017/070527, filed on Jan. 7, 2017, the entire contents of which are incorporated herein by reference.

TECHNICAL FIELD

Embodiments of the present disclosure generally relates to charging technical field, and more particularly, to an adapter, and a charging control method.

BACKGROUND

An adapter, also called as a power adapter, is configured to charge a device to be charged (such as a terminal). Nowadays, the adapter on the market typically charges the device to be charged (such as the terminal) in a constant voltage mode. Since a battery in the device to be charged is typically a lithium battery, it is easy to cause lithium precipitation when the device to be charged is charged in the constant voltage made, thus shortening service lifespan of the battery.

SUMMARY

Embodiments of the present disclosure provide an adapter. The adapter includes a power conversion unit, a sampling and holding unit, and a current collecting and controlling unit. The power conversion unit is configured to convert input alternating current to obtain output voltage and output current of the adapter, in which the output current of the power adapter is first current with first pulsating waveform. The sampling and holding unit is coupled to the power conversion unit, and configured to sample the first current when the sampling and holding unit is in a sampling state, and to hold a peak value of the first current when the sampling and holding unit is in a holding state. The current collecting and controlling unit is coupled to the sampling and holding unit, and configured to determine whether the sampling and holding unit is in the holding state, and to collect the peak value of the first current held in the sampling and holding unit when the sampling and holding unit is in the holding state.

Embodiments of the present disclosure provide a charging control method. The charging control method is applied in an adapter. The adapter includes a power conversion unit and a sampling and holding unit. The power conversion unit is configured to convert input alternating current to obtain output voltage and output current of the adapter, in which the output current of the power adapter is first current with first pulsating waveform. The sampling and holding unit is coupled to the power conversion unit, and configured to sample the first current when the sampling and holding unit is in a sampling state, and to hold a peak value of the first current when the sampling and holding unit is in a holding state. The method includes: determining whether the sampling and holding unit is in the holding state; collecting the peak value of the first current held in the sampling and holding unit when the sampling and holding unit is in the holding state.

BRIEF DESCRIPTION OF THE DRAWINGS

In order to make the technical solutions of embodiments of the present disclosure more clearly, the accompanying drawings used in the description of embodiments of the present disclosure are briefly described hereunder. Obviously, the described drawings are merely some embodiments of present disclosure. For those skilled in the art, other drawings may be obtained based on these drawings without any creative work.

DETAILED DESCRIPTION

Figure 1:
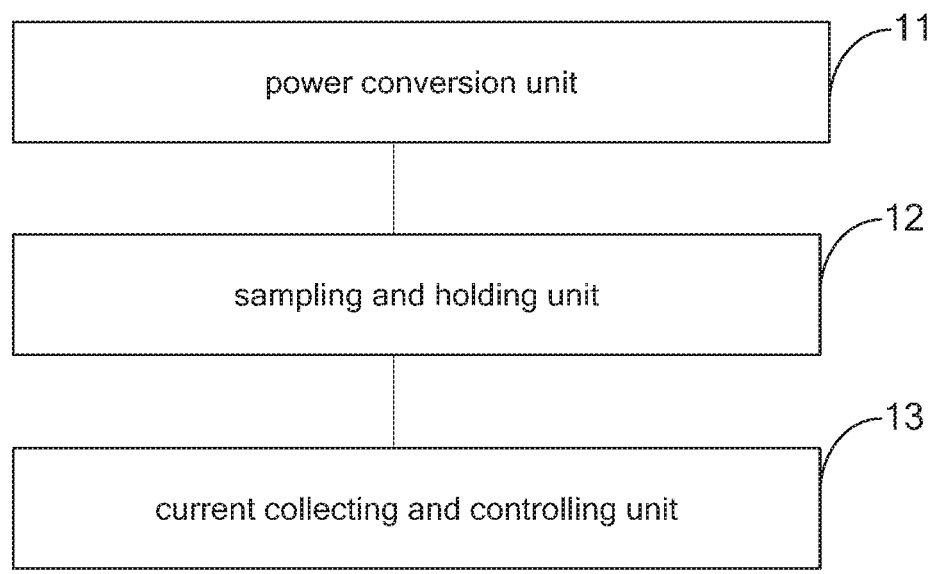
FIG. 1 is a block diagram illustrating a second adapter according to an embodiment of the present disclosure.

The technical solutions in embodiments of the present disclosure are hereinafter described clearly and completely with reference to the accompanying drawings in embodiments of the present disclosure. It should be understood that, embodiments described herein are a part of embodiments of the present disclosure, but not all. Based on embodiments of the present disclosure, all other embodiments obtained by those skilled in the art without creative work should fall within the scope of the present disclosure.

In the related art, a first adapter configured to charge a device to be charged (such as a terminal) is presented. The first adapter is suitable for working in a constant voltage mode. In the constant voltage mode, voltage outputted by the first adapter is basically constant, such as 5V, 9V, 12V or 20V etc.

The voltage outputted by the first adapter is unsuitable for being directly applied to two ends of a battery. It is required to convert the voltage by a conversion circuit in the device to be charged (such as the terminal) to obtain charging voltage and/or charging current expected by the battery in the device to be charged (such as the terminal).

The conversion circuit is configured to convert the voltage outputted by the first adapter, so as to meet requirements for the charging voltage and/or the charging current expected by the battery.

As an example, the conversion circuit may be a charging management module, such as a charging integrated circuit (IC). During a process of charging the battery, the conversion circuit may be configured to manage the charging voltage and/or the charging current of the battery. The conversion circuit has voltage feedback function and/or current feedback function, so as to realize management on the charging voltage and/or the charging current of the battery.

For example, the process of charging the battery may include at least one of a trickle charging stage, a constant current charging stage and a constant voltage charging stage. In the trickle charging stage, the conversion circuit may be configured to utilize a current feedback loop to ensure that current flowing into the battery within the trickle charging stage meets the charging current (such as first charging current) expected by the battery. In the constant current charging stage, the conversion circuit may be configured to utilize a current feedback loop to ensure that current flowing into the battery within the constant current charging stage meets the charging current (such as second charging current, which may be greater than the first charging current) expected by the battery. In the constant voltage charging stage, the conversion circuit may be configured to utilize a voltage feedback loop to ensure that voltage applied to two ends of the battery within the constant voltage charging stage meets the charging voltage expected by the battery.

As an example, when the voltage outputted by the first adapter is greater than the charging voltage expected by the battery, the conversion circuit may be configured to perform buck conversion on the voltage outputted by the first adapter, such that buck-converted voltage meets the requirement of the charging voltage expected by the battery. As another example, when the voltage outputted by the first adapter is less than the charging voltage expected by the battery, the conversion circuit may be configured to perform boost conversion on the voltage outputted by the first adapter, such that boost-converted voltage meets the requirement of the charging voltage expected by the battery.

As another example, assume that the first adapter outputs constant voltage of 5V. When the battery includes a single battery cell (such as a lithium battery cell, a charging cut-off voltage of the single battery cell is 4.2V), the conversion circuit (for example, a buck circuit) may perform the buck conversion on the voltage outputted by the first adapter, such that the charging voltage obtained after the buck conversion meets the requirement of the charging voltage expected by the battery.

As yet another example, assume that the first adapter outputs constant voltage of 5V. When the first adapter charges two or more battery cells (such as a lithium battery cell, a charging cut-off voltage of the single battery cell is 4.2V) coupled in series, the conversion circuit (for example, a boost circuit) may perform the boost conversion on the voltage outputted by the first adapter, such that the charging voltage obtained after the boost conversion meets the requirement of the charging voltage expected by the battery.

Limited by poor conversion efficiency of the conversion circuit, an unconverted part of electric energy is dissipated in a form of heat, and this part of heat may gather inside the device to be charged (such as the terminal). A design space and a cooling space of the device to be charged (such as the terminal) are small (for example, a physical size of a mobile terminal used by a user becomes thinner and thinner, while plenty of electronic components are densely arranged in the mobile terminal to improve performance of the mobile terminal), which not only increases difficulty in designing the conversion circuit, but also results in that it is hard to dissipate the heat gathered in the device to be charged (such as the terminal) in time, thus further causing abnormity of the device to be charged (such as the terminal).

For example, heat gathered on the conversion circuit may cause thermal interference on electronic components neighboring the conversion circuit, thus causing abnormal operations of the electronic components. For another example, heat gathered on the conversion circuit may shorten service lifespan of the conversion circuit and neighboring electronic components. For yet another example, heat gathered on the conversion circuit may cause thermal interference on the battery, thus causing abnormal charging and discharging of the battery. For still another example, heat gathered on the conversion circuit may increase temperature of the device to be charged (such as the terminal), thus affecting user experience during the charging. For still yet another example, heat gathered on the conversion circuit may short-circuit the conversion circuit, such that the voltage outputted by the first adapter is directly applied to two ends of the battery, thus causing over-voltage charging of the battery, which even brings safety hazard, for example, the battery may explode, if the over-voltage charging lasts for a long time period.

A second adapter of which the output voltage is adjustable is provided in embodiments of the present disclosure. The second adapter may obtain status information of the battery. The status information of the battery may include electric quantity information and/or voltage information of the battery. The second adapter may adjust the voltage outputted by itself according to the obtained status information of the battery, to meet the requirement of the charging voltage and/or the charging current expected by the battery. Further, during the constant current charging stage of the battery charging process, the output voltage of the second adapter after the adjustment may be directly applied to two ends of the battery for charging the battery.

The second adapter may have voltage feedback function and/or current feedback function, so as to realize management on the charging voltage and/or the charging current of the battery.

In some embodiments, the second adapter may adjust the voltage outputted by the second adapter according to the obtained status information of the battery as follows. The second adapter may obtain the status information of the battery in real time, and adjust the voltage outputted by itself according to the status information of the battery obtained in real time, to meet the charging voltage and/or the charging current expected by the battery.

The second adapter may adjust the voltage outputted by itself according to the status information of the battery obtained in real time as follows. With the increasing of the voltage of the battery during the charging process, the second adapter may obtain status information of the battery at different time points in the charging process, and adjust the voltage outputted by itself in real time according to the status information of the battery, to meet the requirement of the charging voltage and/or the charging current expected by the battery.

For example, the process of charging the battery may include at least one of a trickle charging stage, a constant current charging stage and a constant voltage charging stage. In the trickle charging stage, the second adapter may be configured to utilize the current feedback loop to ensure that the current outputted by the second adapter and flowing into the battery within the trickle charging stage meets the requirement of the charging current expected by the battery (such as the first charging current). In the constant current charging stage, the second adapter may be configured to utilize the current feedback loop to ensure that the current outputted by the second adapter and flowing into the battery within the constant current charging stage meets the requirement of the charging current expected by the battery (such as the second charging current greater than the first charging current). Moreover, in the constant current charging stage, the charging voltage outputted by the second adapter may be directly applied to two ends of the battery for charging the battery. In the constant voltage charging stage, the second adapter may be configured to utilize the voltage feedback loop to ensure that voltage outputted by the second adapter meets the requirement for charging voltage expected by the battery.

In the trickle charging stage and the constant voltage charging stage, the voltage outputted by the second adapter may be processed in the same manner as the first adapter, i.e., the voltage is converted by the conversion circuit in the device to be charged (such as the terminal) to obtain the charging voltage and/or the charging current expected by the battery in the device to be charged (such as the terminal).

In order to improve reliability and safety of the process of charging the battery, in embodiments of the present disclosure, the second adapter is controlled to output voltage and/or current with pulsating waveform. In the following, the second adapter according to embodiments of the present disclosure will be described in detail with reference to FIG. 1.

FIG. 1 is a block diagram illustrating a second adapter according to embodiments of the present disclosure. The second adapter 10 illustrated in FIG. 1 includes a power conversion unit 11, a sampling and holding unit 12 and a current collecting and controlling unit 13.

The power conversion unit 11 is configured to convert input alternating current to obtain output voltage and output current of the second adapter 10. The output current of the second adapter 10 is first current with first pulsating waveform.

The sampling and holding unit 12 is coupled to the power conversion unit 11. The sampling and holding unit 12 is configured to sample the first current when the sampling and holding unit 12 is in a sampling state, and to hold (or lock-in) a peak value of the first current when the sampling and holding unit 12 is in a holding state.

The current collecting and controlling unit 13 is coupled to the sampling and holding unit 12. The current collecting and controlling unit 13 is configured to determine whether the sampling and holding unit 12 is in the holding state, and to collect the peak value of the first current held in the sampling and holding unit 12 when the sampling and holding unit 12 is in the holding state.

In embodiments of the present disclosure, the output current of the second adapter is current with pulsating waveform (or called as pulsating direct current). The current with the pulsating waveform may reduce the lithium precipitation of the battery. In addition, the current with the pulsating waveform may reduce probability and intensity of arc discharge of a contact of a charging interface, and improve service lifespan of the charging interface.

The second adapter typically adjusts the output current of the second adapter according to actual situations. For example, if the second adapter supports a constant current mode, the second adapter adjusts the output current of the second adapter continually based on the battery voltage of the device to be charged (such as the terminal), so as to charge the battery in a multi-stage constant current manner. Thus, in the charging process, it is required to detect and control the output current of the second adapter in real time. If the output current of the second adapter is constant, it is easy to realize the detection and control of the output current of the second adapter. However, in embodiments of the present disclosure, the output current of the second adapter is first current with first pulsating waveform. The magnitude of the first current is fluctuant, thus it needs to design a special method to detect and control the output current of the second adapter.

Given this, in embodiments of the present disclosure, the sampling and holding unit 12 and the current collecting and controlling unit 13 are introduced. Since a peak value of the output current of the second adapter may be sampled based on the sampling and holding unit 12 and the current collecting and controlling unit 13, the effective control on the output current of the second adapter can be guaranteed.

Figure 2A:
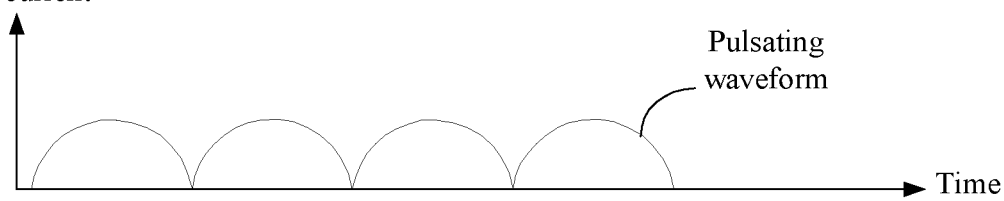
FIG. 2A and FIG. 2B are schematic diagrams each illustrating a pulsating waveform according to an embodiment of the present disclosure.
Figure 2B:
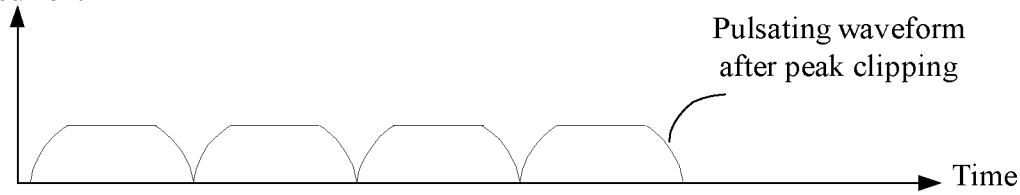

It is pointed out that, the output current of the second adapter is the first current with the first pulsating waveform. The pulsating waveform herein may be a complete pulsating waveform or a pulsating waveform obtained by performing a peak clipping on a complete pulsating waveform. The peak clipping refers to that, a part of the pulsating waveform which exceeds a certain threshold is filtered out to realize the control on the peak value of the pulsating waveform. In an embodiment illustrated in FIG. 2A, the pulsating waveform is a complete waveform. In an embodiment illustrated in FIG. 2B, the pulsating waveform is a pulsating waveform after the peak clipping.

It should be understood that, the method that the power conversion unit 11 converts the alternating current to the first current with the first pulsating waveform is not limited in embodiments of the present disclosure. For example, a primary filtering unit and a secondary filtering unit in the power conversion unit 11 may be removed, such that the first current with the first pulsating waveform may be generated. This not only allows the second adapter 10 to output the first current with the first pulsating waveform, but also reduces drastically a size of the second adapter 10 in favor of miniaturization of the second adapter 10.

The device to be charged applied in embodiments of the present disclosure may be a "communication terminal" (or "terminal" for short). The device to be charged includes, but is not limited to a device configured to receive/transmit communication signals via wired connection (for example, public switched telephone network (PSTN), digital subscriber line (DSL), digital cable, a direct cable and/or another data connection/network) and/or via a wireless interface (for example, cellular network, wireless local area network (WLAN), digital TV network such as digital video broadcasting handheld (DVB-H) network, satellite network, an amplitude modulation-frequency modulation (AM-FM) broadcasting transmitter, and/or a wireless interface of another communication terminal. The communication terminal configured to communicate via the wireless interface may be referred to as "wireless communication terminal", "wireless terminal" and/or "mobile terminal". Examples of the mobile terminal include, but are not limited to a satellite phone or a cell phone, a terminal combining a cell radio phone and a personal communication system (PCS) having capability of data process, fax, and data communication, a personal digital assistant (PDA) including a radio phone, a pager, an Internet/Intranet access, a web browser, a notepad & address book, a calendar and/or a global positioning system (GPS) receiver, and a common laptop and/or handheld receiver, or other electronic device including a radio phone transceiver.

Figure 19A:
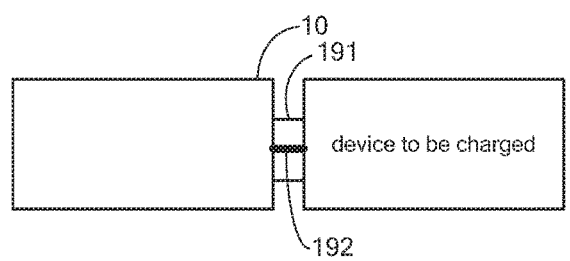
FIG. 19A is a schematic diagram illustrating a coupling between a device to be charged and a second adapter according to an embodiment of the present disclosure.

In some embodiments, the second adapter 10 may include a charging interface (referring to the charging interface 191 illustrated in FIG. 19A). However a type of the charging interface is not limited in embodiments of the present disclosure. For example, the charging interface may be a universal serial bus (USB) interface, which may be a common USB interface or a micro USB interface, or a Type-C interface.

The implementation of the sampling and holding unit 12 is not limited in embodiments of the present disclosure. Typically, the sampling and holding unit 12 may sample and hold the signal based on a capacitor. In the following, a specific implementation of the sampling and holding unit 12 will be described with reference to FIG. 3.

Figure 3:
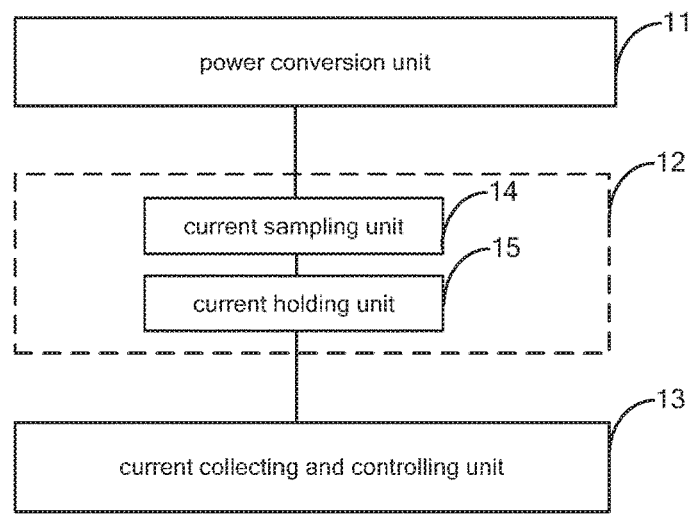
FIG. 3 is a block diagram illustrating a second adapter according to another embodiment of the present disclosure.

In some embodiments, as illustrated in FIG. 3, the sampling and holding unit 12 may include a current sampling unit 14 and a current holding unit 15. The current sampling unit 14 is coupled to the power conversion unit 11. The current sampling unit 14 is configured to detect the first current to obtain a sampling current, and to convert the sampling current to a sampling voltage. The sampling voltage is configured to indicate the first current. The current holding unit 15 is coupled to the current sampling unit 14 and the current collecting and controlling unit 13 respectively. The current holding unit 15 is configured to receive the sampling voltage from the current sampling unit 14 and to charge a capacitor (not illustrated in FIG. 3) in the current holding unit 15 based on the sampling voltage. The current sampling unit 13 obtains the peak value of the first current with the first pulsating waveform by sampling voltage across two ends of the capacitor in the current collecting and controlling unit 13.

When the first pulsating waveform is at rising edge, capacitance of the capacitor in the current holding unit 15 increases with the increasing of value of the first current with the first pulsating waveform, and the sampling and holding unit 12 is in the sampling state. When the first pulsating waveform is at peak or falling edge, the voltage across two ends of the capacitor in the current holding unit 15 keeps constant, and the sampling and holding unit 12 is in the holding state.

In embodiments of the present disclosure, the current collecting and controlling unit 13 samples the peak value of the first current with the first pulsating waveform held in the sampling and holding unit 12. In some embodiments, the current collecting and controlling unit 13 may include an analogue digital converter (ADC). The current collecting and controlling unit 13 may sample the peak value of the first current with the first pulsating waveform based on the ADC. In some embodiments, the current controlling unit 13 may further comprises a first control unit. The first control unit may be a microcontroller unit (MCU), for example. The first control unit includes an ADC port. The first control unit is coupled to the capacitor in the sampling and holding unit 12 via the ADC port, and samples the peak value of the first current by sampling the voltage across two ends of the capacitor.

When the sampling and holding unit 12 is in the sampling state, the voltage across two ends of the capacitor may increase with the increasing of the value of the first current with the first pulsating waveform, which corresponds to the charging process. When the sampling and holding unit 12 is in the holding state, the voltage across two ends of the capacitor reaches a maximum value. A correspondence between the voltage across two ends of the capacitor and value of the first current may be established in advance. In this case, the current sampling and controlling unit 13 may know the peak value of the first current by sampling the voltage across two ends of the capacitor.

In some embodiments, the current sampling and controlling unit 13 is further configured to control the sampling and holding circuit 12 to switch from the holding state to the sampling state after sampling the peak value of the first current with the first pulsating waveform.

In detail, the peak value of the first current with the first pulsating waveform may change in real time, such that it is required to detect the peak value of the first current with the first pulsating waveform continually to ensure instantaneity and accuracy of current information, and further ensure success of the whole charging process. Based on this, after sampling the peak value of the first current, the current collecting and controlling unit 13 provided in embodiments of the present disclosure may control the sampling and holding unit 12 to enter the sampling state so as to sample the first current again, thereby ensuring that the peak value of the first current with the first pulsating waveform may be sampled in real time and accurately.

Further, in some embodiments, the current collecting and controlling unit 13 may finish one sampling of the peak value within each cycle of the first pulsating waveform, and may control the sampling and holding unit 12 to switch from the holding state to the sampling state immediately after sampling the peak value. In this way, the peak value of the first current with the first pulsating waveform sampled by the current collecting and controlling unit 13 may be updated in unit of the cycle of the first pulsating waveform, thus ensuring that the peak value of the first current with the first pulsating waveform in real time and accurately.

It can be seen from that, the output current of the second adapter 10 which is the charging current is the first current with the first pulsating waveform. The charging current may charge the battery intermittently, and the cycle of the charging current may vary with frequency of power grid. In some embodiments, the frequency corresponding to the cycle of the charging current may be an integral multiple or a fraction of the frequency of the power grid. In other words, the charging current may charge the battery intermittently. In some embodiments, the charging current may be formed of one pulse or one set of pulses synchronous to the power grid.

It should be understood that, the current collecting and controlling unit 13 may control the sampling and holding unit 12 to switch from the holding state to the sampling state in many ways. For example, the current sampling unit 13 may control the capacitor in the sampling and holding unit 12 to discharge so as to clear electric charge at two ends of the capacitor, such that the capacitor in the sampling and holding unit 12 can be used to charge again when the next sampling cycle comes.

Figure 4:
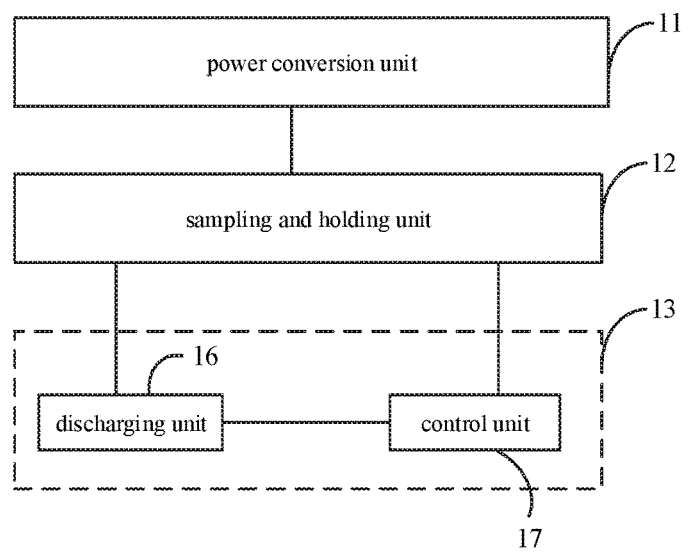
FIG. 4 is a block diagram illustrating a second adapter according to yet another embodiment of the present disclosure.

In some embodiments, as illustrated in FIG. 4, the sampling and holding unit 12 can hold the peak value of the first current with the first pulsating waveform based on the capacitor (not illustrated in FIG. 4) in the sampling and holding unit 12. The current collecting and controlling unit 13 can include a discharging unit 16 and a third control unit 17. The discharging unit 16 is coupled to the third control unit 17 and the capacitor in the sampling and holding unit 12 respectively. The discharging unit 16 is configured to release electric charge at two ends of the capacitor in the sampling and holding unit 12 under the control of the third control unit 17, such that the sampling and holding unit 12 may switch from the holding state to the sampling state. Further, the third control unit 17 may realize the sampling of the peak value of the first current with the first pulsating waveform held in the sampling and holding unit 12.

There are many implementations of the discharging unit 16. For example, the discharging unit 16 may include a switch and a resistor both coupled to the capacitor in the sampling and holding unit 12 in series. When it needs to discharge, the third control unit 17 controls the switch to switch on, such that the capacitor discharges via the resistor, thus consuming the electric charge at two ends of the capacitor.

In embodiments of the present disclosure, the method that the current collecting and controlling unit 13 determines whether the sampling and holding unit 12 is in the holding state is not limited, which may be described in detail with reference to specific embodiments.

In some embodiments, the current collecting and controlling unit 13 may detect the current value sampled by the sampling and holding unit 12 in real time. If the current value detected keeps constant in two successive times, it indicates that the sampling and the holding unit 12 is in the holding state.

In some embodiments, the current collecting and controlling unit 13 is configured to receive a synchronization signal, and to determine whether the sampling and the holding unit 12 is in the holding state based on the synchronization signal. The cycle of the synchronization signal is 1/N of the cycle of the first pulsating waveform, where N is an integer greater than or equal to 1.

Since the first current with the first pulsating waveform changes periodically, the time interval during which the sampling and holding unit 12 switches from the sampling state to the holding state is related to the cycle of the first current with the first pulsating waveform (the time interval may be ½ of the cycle of the first current with the first pulsating waveform). Based on this, in embodiments of the present disclosure, the synchronization signal having a specific relation to the cycle of the first pulsating waveform (i.e., the cycle of the synchronization signal is 1/N of the cycle of the first pulsating waveform) is incorporated, and a working state of the sampling and holding unit 12 can be determined based on the synchronization signal. For example, cycle and/or phase relation between the synchronization signal and the first pulsating waveform may be utilized, to determine whether the first pulsating waveform is at peak or falling edge. If the first pulsating waveform is at peak or falling edge, it can be determined that the sampling and holding unit 12 is in the holding state. Herein, determining whether the first pulsating waveform is at peak or falling edge refers to determining whether the first pulsating waveform is at peak or falling edge of the first pulsating waveform. In an embodiment, determining whether the first pulsating waveform is at peak or falling edge refers to determining whether the output current of the second adapter is at peak or falling edge of the first pulsating waveform, or determining whether the output current of the second adapter is a current corresponding to the peak or falling edge of the first pulsating waveform.

As an implementation, in some embodiments, the cycle of the first pulsating waveform is the same as the cycle of the synchronization signal. Further, in some embodiments, the first pulsating waveform and the synchronization signal may at the same phase. In other words, if the synchronization signal is at rising edge, the first pulsating waveform is at rising edge. If the synchronization signal is at peak or falling edge, the first pulsating waveform is at peak or falling edge. Since the first pulsating waveform is at peak or falling edge, the sampling and holding unit 12 is in the holding state. Thus, as long as when the synchronization signal is at peak or falling edge is determined, it can be determined when the sampling and holding unit 12 is in the holding state. In other embodiments, a difference between the phase of the first pulsating waveform and that of the synchronization signal is a fixed value, for example 90 degree, or 180 degree. In this case, it can be determined when the first pulsating waveform is at peak or falling edge based on a cycle relation and a phase relation between the first pulsating waveform and the synchronization signal, thus it can be determined when the sampling and holding unit 12 is in the holding state.

Figure 5:
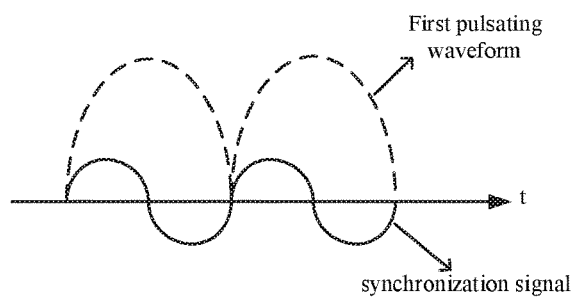
FIG. 5 is a schematic diagram illustrating a phase relationship between a synchronization signal and a first pulsating waveform according to an embodiment of the present disclosure.

If the cycle of the synchronization signal is ½, ⅓ or ¼ of the cycle of the first pulsating waveform, the working state of the sampling and holding unit 12 can be determined based on the phase relation and cycle relation between the synchronization signal and the first pulsating waveform. As illustrated in FIG. 5, a waveform of the synchronization signal is indicated by a solid line. A waveform of the first pulsating waveform is indicated by a dashed line. The cycle of the synchronization signal is ½ of the cycle of the first pulsating waveform. When the synchronization signal is at a negative cycle, the first pulsating waveform is at peak or falling edge, such that the sampling and holding unit 12 is in the holding state. Thus, it only needs to determine when the waveform of the synchronization signal is at the negative cycle, such that it can be determined when the first pulsating waveform is at peak or falling edge. It is similar in other cases, which are not listed.

In addition, the synchronization signal is a synchronization signal of a pulsating waveform, a synchronization signal of a triangular waveform, or a synchronization signal in other types, which is not limited in embodiments of the present disclosure.

The method for obtaining the synchronization signal is not limited in embodiments of the present disclosure, which will be described below with reference to specific embodiments.

In some embodiment, the current collecting and controlling unit 13 is coupled to the power conversion unit 11, and configured to obtain the synchronization signal from the power conversion unit 11.

It should be understood that, the synchronization signal obtained from the power conversion unit 11 may be an alternating current signal received by the power conversion unit 11, a current/voltage signal after performing a filtering on a primary side of the power conversion unit 11, a current/voltage signal coupled from the primary side to a secondary side of the power conversion unit 11, a current/voltage signal after performing a filtering on the secondary side, which is not limited in embodiments of the present disclosure.

Figure 6:
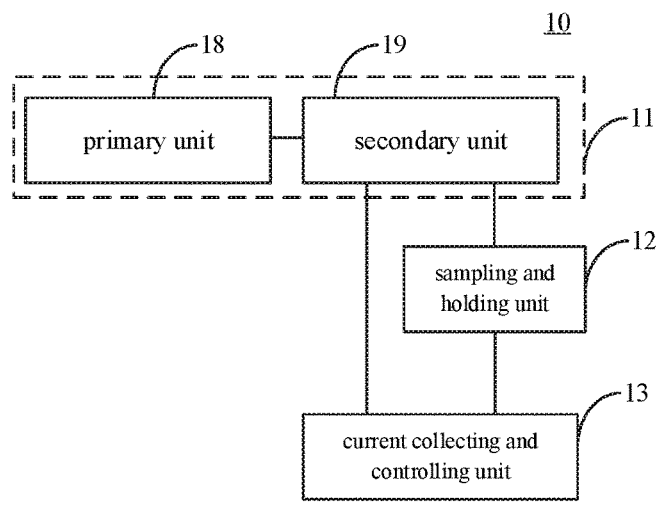
FIG. 6 is a block diagram illustrating a second adapter according to still another embodiment of the present disclosure.

In some embodiments, as illustrated in FIG. 6, the power conversion unit 11 may include a primary unit 18 and a secondary unit 19. The current collecting and controlling unit 13 is coupled to the secondary unit 19, and configured to obtain the synchronization signal from the secondary unit 19.

Figure 7:
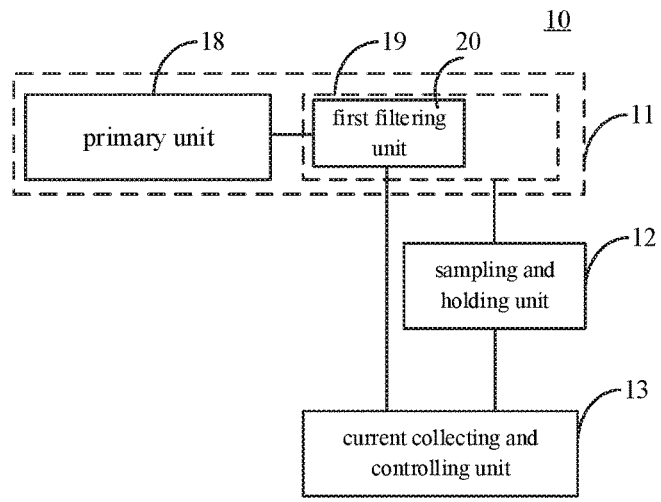
FIG. 7 is a block diagram illustrating a second adapter according to still yet another embodiment of the present disclosure.

It should be understood that, there are many ways to obtain the synchronization signal from the secondary unit 19. For example, the synchronization signal may be obtained directly from a bus (VBUS) of the secondary unit 19. In detail, since the second adapter 10 outputs the first current with the first pulsating waveform and an output end of the second adapter 10 is coupled to the bus of the secondary unit 19, the first current with the first pulsating waveform may present on the bus of the secondary unit 19, such that the synchronization signal may be obtained from the bus of the secondary unit 19 directly. As illustrated in FIG. 7, the secondary unit 19 may include a first filtering unit 20. The first filtering unit 20 is coupled to the current collecting and controlling unit 13. The first filtering unit 20 is configured to filter the current coupled from the primary unit 18 to the secondary unit 19, to obtain second voltage with second pulsating waveform as the synchronization signal, and to send it to the current collecting and controlling unit 13.

Figure 21:
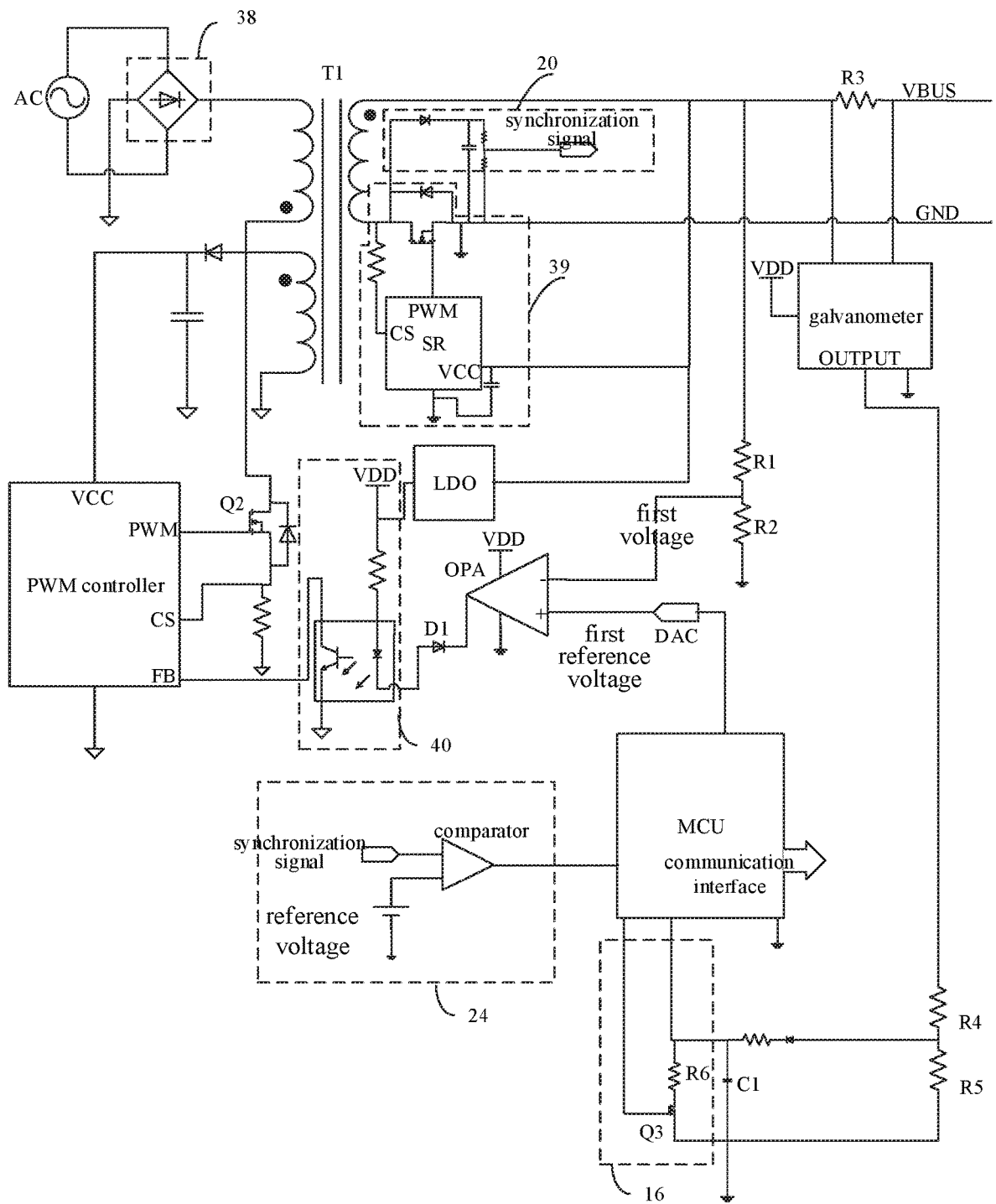
FIG. 21 is a circuit schematic diagram illustrating a second adapter according to an embodiment of the present disclosure.

The secondary unit 19 includes a secondary filtering unit. The secondary filtering unit and the first filtering unit 20 may be two separate filtering units. The secondary filtering unit is configured to filter the current coupled from the primary side to the secondary side to obtain the output current of the second adapter. The first filtering unit is configured to filter the current coupled from the primary side to the secondary side to obtain the synchronization signal. As illustrated in FIG. 21, the unit indicated by reference numeral 39 in FIG. 21 is the secondary filtering unit. Both the second filtering unit 39 and the first filtering unit 20 may at the side of the secondary winding of the transformer T1, such that the second adapter may filter the current coupled from the primary side to the secondary side.

Figure 8:
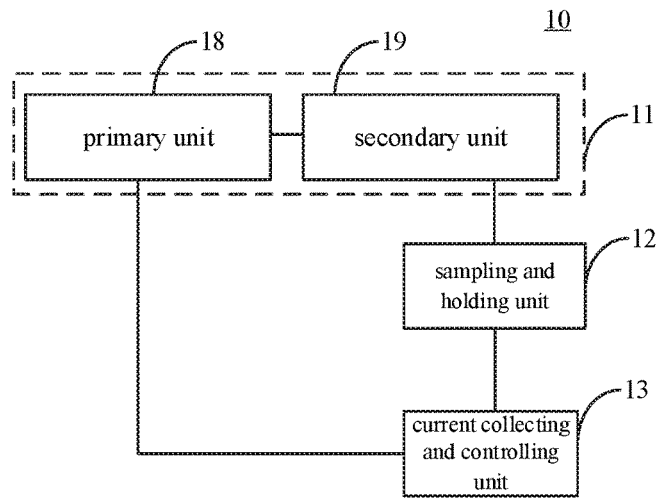
FIG. 8 is a block diagram illustrating a second adapter according to still yet another embodiment of the present disclosure.

In some embodiments, as illustrated in FIG. 8, the power conversion unit 11 may include a primary unit 18 and a secondary unit 19. The current collecting and controlling unit 13 is coupled to the primary unit 18, and configured to obtain the synchronization signal from the primary unit 18.

It should be understood that, there are many ways to obtain the synchronization signal from the primary unit 18. For example, the alternating current signal may be obtained directly from the primary unit 18, configured as the synchronization signal and sent to the current collecting and controlling unit 13. The pulsating direct current signal obtained by filtering of the filtering circuit in the primary unit 18 may be configured as the synchronization signal, and sent to the current collecting and controlling unit 13.

Figure 9:
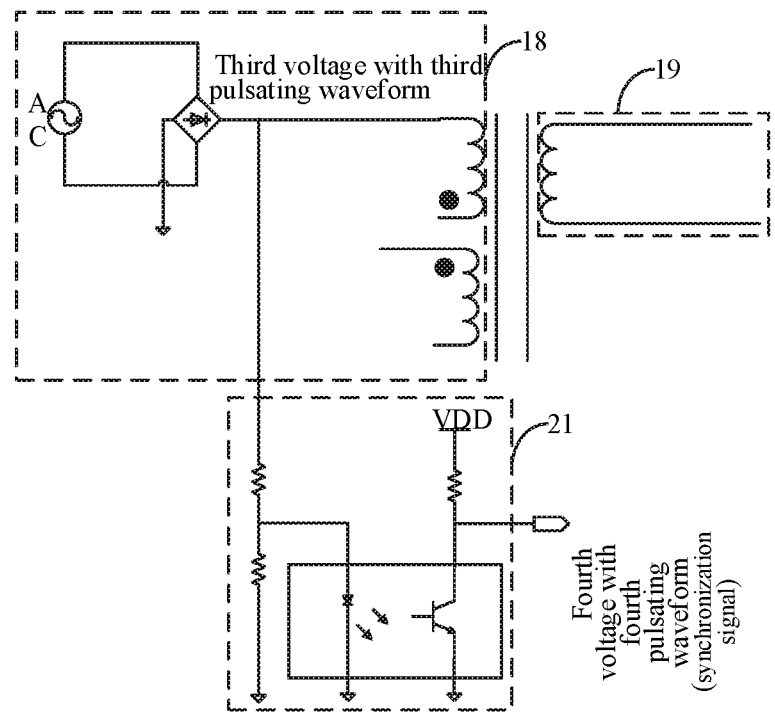
FIG. 9 is a schematic diagram illustrating a way of obtaining a synchronization signal according to an embodiment of the present disclosure.

In detail, as illustrated in FIG. 9, the primary unit 18 filters the alternating current AC to obtain third voltage with third pulsating waveform. The third pulsating waveform has the same cycle as the first pulsating waveform. The primary unit 18 may obtain fourth voltage with fourth waveform by coupling the third voltage from the primary side of the second adapter 10 to the secondary side with an optical coupling unit 21, configure the fourth voltage with the fourth waveform as the synchronization signal, and send it to the current collecting and controlling unit 13. As an implementation, the primary unit 18 may send directly the third voltage with the third pulsating waveform to the current collecting and controlling unit 13 without passing by the optical coupling unit 21, which is not limited in embodiments of the present disclosure.

With referent to specific embodiments, the method of obtaining the synchronization signal from the power conversion unit 11 is described in detail, which is not limited to this. In the following, other methods of obtaining the synchronization signal will be provided.

In some embodiments, the current collecting and controlling unit 13 may obtain the synchronization signal from the sampling and holding unit 12.

In detail, the sampling and holding unit 12 samples the output current of the second adapter, i.e., the first current with the first pulsating waveform, to obtain the sampling current, such that a signal such as the sampling current obtained by the sampling and holding unit 12 or a sampling voltage corresponding to the sampling current has the same cycle and phase as the first current with the first pulsating waveform. By configuring the sampling current or the sampling voltage as the synchronization signal, the process of determining the working state of the sampling and holding unit 12 may be simplified.

Generally, the sampling and holding unit 12 may sample the first current with the first pulsating waveform to obtain the sampling current and convert the sampling current to the sampling voltage. The sampling voltage may be used to indicate a value of the first current with the first pulsating waveform. The sampling and holding unit 12 can configure the sampling voltage as the synchronization signal, and send it to the current collecting and controlling unit 13. For example, as illustrated in FIG. 21, a voltage signal outputted from an output end of a galvanometer illustrated in FIG. 21 may be configured as the synchronization signal.

The methods of obtaining the synchronization signal are described above. A method of determining whether the first pulsating waveform is at peak or falling edge based on the synchronization signal is described in detail with reference to specific embodiments in the following.

In some embodiments, the current collecting and controlling unit 13 determines whether the first pulsating waveform is at peak or falling edge based on the synchronization signal and collects the peak value of the first current with the first pulsating waveform held in the sampling and holding unit 12 when determining that the first pulsating waveform is at peak or falling edge.

In detail, the sampling and holding unit 12 may switch between the sampling state and the holding state based on charging or discharging of the capacitor. When the first pulsating waveform is at rising edge, the capacitor in the sampling and holding unit 12 is in a charging state, and the voltage across two ends of the capacitor increases with the increasing of the first current with the first pulsating waveform. In this case, the sampling and holding unit 12 is in the sampling state. When the first pulsating waveform is at peak or falling edge, the voltage across two ends of the capacitor does not increase. In this case, the sampling and holding unit 12 is in the holding state. Thus, by determining when the first pulsating waveform is at peak or falling edge, it can be determined when the sampling and holding unit 12 is in the holding state. Since the cycle and phase of the synchronization signal have fixed relations to those of the first pulsating waveform, it may be determined whether the first pulsating waveform is at peak or falling edge based on the cycle and/or phase of the synchronization signal. For example, if the synchronization signal has the same phase as the first pulsating waveform, the first pulsating waveform is at peak or falling edge when the synchronization signal is at peak or falling edge. For another example, if the cycle of the synchronization signal is the same as that of the first pulsating waveform, and the phase of the synchronization signal differs from that of the first pulsating waveform by half cycle, the first pulsating waveform is at peak or falling edge when the synchronization signal is at rising edge.

There are many ways to detect the phase of the synchronization signal. For example, the current or voltage may be detected in real time by a rheometer or voltmeter, to determine the phase of the synchronization signal, thus further determine whether the first pulsating waveform is at peak or falling edge. However, in this way, an additional voltage and current detection circuit is required, which is complicated to implement. In the following, two implementations based on comparator are provided, and the voltage of the synchronization signal and a reference voltage are compared, such that it may be convenient to determine whether the first pulsating waveform is at peak or falling edge.

Figure 10:
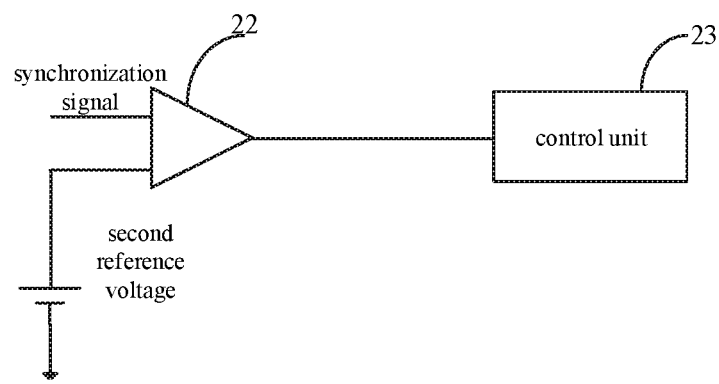
FIG. 10 is a schematic diagram illustrating a current collecting and controlling unit according to an embodiment of the present disclosure.

In some embodiments, as illustrated in FIG. 10, the current collecting and controlling unit 13 may include a first comparator 22 and a second control unit 23. A first input end of the comparator 22 is configured to receive the synchronization signal, and a second input end of the comparator 22 is configured to receive the reference voltage. The second control unit 23 is coupled to an output end of the comparator 22, and is configured to determine whether the first pulsating waveform is at peak or falling edge based on a comparison result of the voltage of the synchronization signal and the reference voltage. In some embodiments, the first input end is configured as an in-phase input end of the comparator, and the second input end is configured as an out-phase input end of the comparator. In other embodiments, the first input end is configured as an out-phase input end of the comparator, and the second input end is configured as an in-phase input end of the comparator.

It should be understood that, the method of selecting the value of the reference voltage is not limited in embodiments of the present disclosure. For example, if the synchronization signal is a signal with pulsating waveform having zero crossing point, the value of the reference voltage is selected as a value greater than 0 and less than a peak value of the synchronization signal. If the synchronization signal is an alternating signal, the value of the reference voltage is selected as 0.

Figure 11:
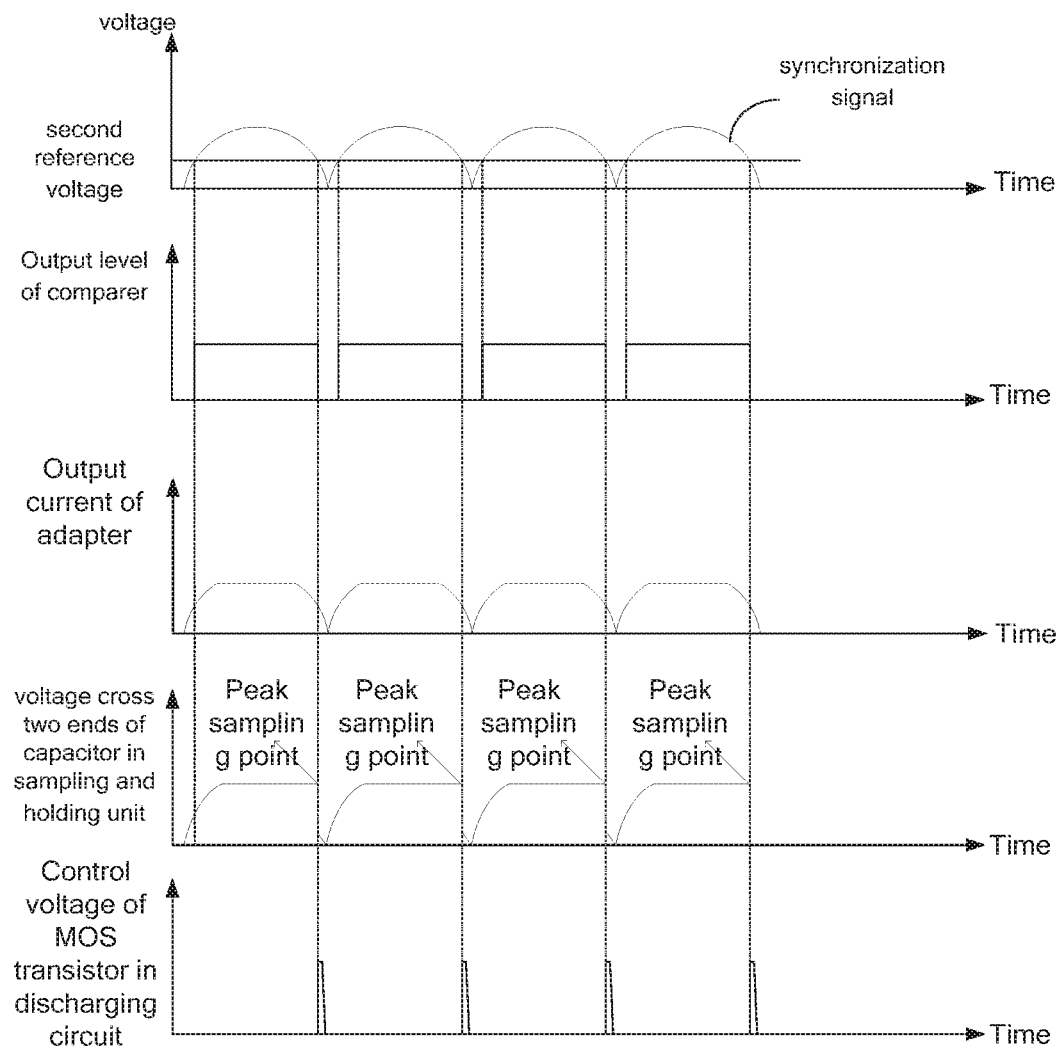
FIG. 11 is a schematic diagram illustrating a waveform relationship among a reference voltage, an output level of a comparator and an output current of a second adapter according to an embodiment of the present disclosure.
Figure 12:
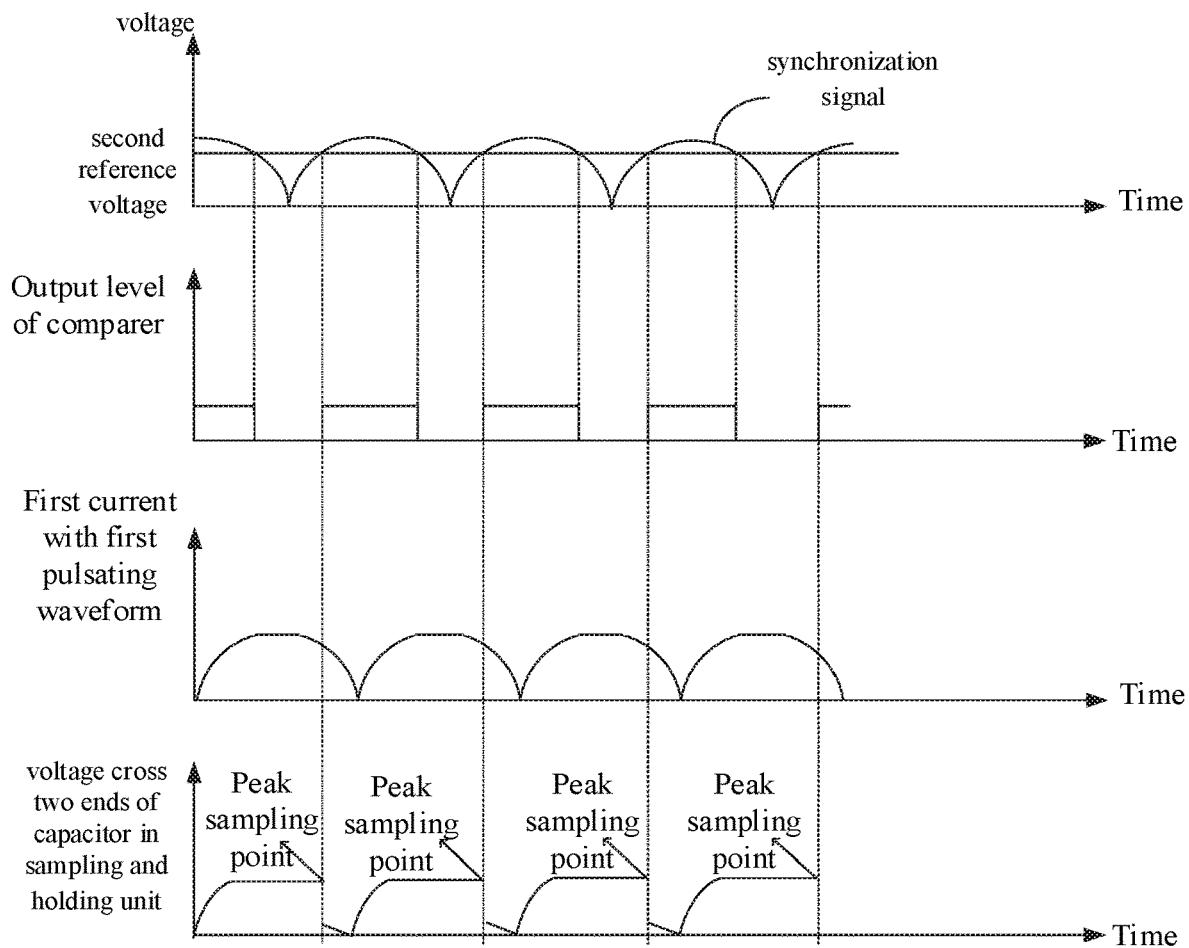
FIG. 12 is a schematic diagram illustrating a waveform relationship among a reference voltage, an output level of a comparator and an output current of a second adapter according to another embodiment of the present disclosure.

In addition, the method for determining whether the first pulsating waveform is at peak or falling edge based on the comparison result of the voltage of the synchronization signal and the reference voltage is not limited in embodiments of the present disclosure, but is related to the cycle and phase of the synchronization signal and the cycle and phase of the first pulsating waveform. As illustrated in FIG. 11 and FIG. 12, for example, when the cycle of the synchronization signal is the same as the cycle of the first pulsating waveform, the method for determining whether the first pulsating waveform is at peak or falling edge will be described as an example. In embodiments illustrated in FIG. 11 and FIG. 12, the current collecting and controlling unit 13 samples the peak value of the first current with the first pulsating waveform held in the sampling and holding unit 12 within each cycle of the first pulsating waveform. After sampling the peak value, the current collecting and controlling unit 13 provides a control voltage to a MOS transistor in the discharging unit immediately, to control the MOS transistor in the discharging unit to switch on, thereby releasing electric charge at two ends of the capacitor in the sampling and holding unit 12. However, FIG. 11 and FIG. 12 are illustrated merely exemplary, but the embodiments of the present disclosure are not limited thereto. For example, the current collecting and controlling unit 13 may sample the peak value of the first current with the first pulsating waveform every several cycles. In addition, the discharging unit may employ other manners, except for the MOS transistor.

In embodiment illustrated in FIG. 11, the synchronization signal and the first pulsating waveform (the pulsating waveform is a pulsating waveform undergoing a peak clipping) are at same phase. It can be seen from FIG. 11 that, since the synchronization signal and the first pulsating waveform are at same phase, when the synchronization signal is at peak or falling edge, the first pulsating waveform is at peak or falling edge, too. Thus, as long as when the synchronization signal is at peak or falling edge of the waveform of the synchronization signal is determined, one can know when the first pulsating waveform is at peak or falling edge.

Further, in order to determine when the synchronization signal is at peak or falling edge, a comparator is incorporated in the embodiment illustrated in FIG. 11. The comparator obtains a variation curve of the output level by comparing the voltage of the synchronization signal with the reference voltage, such as a rectangular wave illustrated in FIG. 11. It can be seen from the rectangular wave that, when the output level is switched from a high level to a low level (hereinafter, "target time"), the first pulsating waveform is at the falling edge. In this case, the capacitor in the sampling and holding unit 12 is in the holding state. Therefore, in embodiments of the present disclosure, the target time is used as a peak value sampling point. The current collecting and controlling unit 13 is controlled to collect the voltage across two ends of the capacitor in the sampling and holding unit 12, to obtain the peak value of the first current with the first pulsating waveform. After the peak value of the first current with the first pulsating waveform is sampled, the MOS transistor in the discharging unit is switched on to release the electric charge at two ends of the capacitor in the sampling and holding unit 12 and to prepare for the next sampling.

In embodiments illustrated in FIG. 12, the phase of the synchronization signal differs from that of the first pulsating waveform by 180 degree, and the first pulsating waveform is the pulsating waveform undergoing the peak clipping. It can be seen from FIG. 12 that, since the phase of the synchronization signal differs from that of the first pulsating waveform by 180 degree, when the synchronization signal is at peak or rising edge, the first pulsating waveform is at peak or falling edge. Thus, as long as when the synchronization signal is at peak or rising edge is determined, one can know when the first pulsating waveform is at peak or falling edge.

Further, in order to determine when the synchronization signal is at peak or rising edge, a comparator is incorporated in the embodiment illustrated in FIG. 12. The comparator obtains a variation curve of the output level by comparing the voltage of the synchronization signal with the reference voltage, such as a rectangular wave illustrated in FIG. 12. It can be seen from the rectangular wave that, when the output level is switched from a low level to a high level (hereinafter, "target time"), the first pulsating waveform is at the falling edge. In this case, the capacitor in the sampling and holding unit 12 is in the holding state. Therefore, in embodiments of the present disclosure, the target time is used as a peak value sampling point. The current collecting and controlling unit 13 is controlled to collect the voltage across two ends of the capacitor in the sampling and holding unit 12, to obtain the peak value of the first current with the first pulsating waveform. After the peak value of the first current with the first pulsating waveform is sampled, the MOS transistor in the discharging unit is switched on to release the electric charge at two ends of the capacitor in the sampling and holding unit 12 and to prepare for the next sampling.

Figure 13:
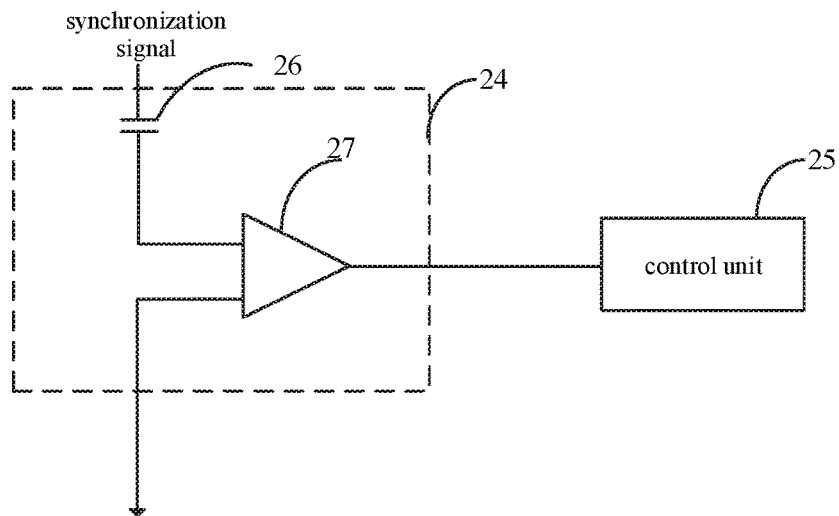
FIG. 13 is a schematic diagram illustrating a current collecting and controlling unit according to another embodiment of the present disclosure.

In some embodiments, as illustrated FIG. 13, the current collecting and controlling unit 13 may include a comparing unit 24 and a second control unit 25. The comparing unit 24 may include a capacitor 26 and a comparator 27. The capacitor 26 is configured to receive the synchronization signal, filter the direct current signal in the synchronization signal and obtain a zero-crossing alternating current signal. A first input end of the comparator 27 is coupled to the capacitor 26, and configured to receive the alternating signal. A second input end of the comparator 27 is configured to receive the reference voltage. The comparator 27 is configured to compare a voltage of the alternating signal with the reference voltage. The second control unit 25 is coupled to an output end of the comparator 27, and configured to determine whether the first pulsating waveform is at peak or falling edge based on a comparison result between the voltage of the alternating signal and the reference voltage. Further, in embodiments of the present disclosure, the value of the reference voltage may be set to 0. In some embodiments, the first input end is configured as an in-phase input end of the comparator, and the second input end is configured as an out-phase input end of the comparator. In other embodiments, the first input end is configured as an out-phase input end of the comparator, and the second input end is configured as an in-phase input end of the comparator.

For example, when the synchronization signal is a signal with pulsating waveform, the signal with the pulsating waveform can be considered as a signal obtained by combining a direct current signal (or a direct current component) with an alternating current signal (or an alternating current component) at the zero-crossing point. The direct current signal in the signal with the pulsating waveform may be filter out by the capacitor 26, and the alternating current signal at the zero-crossing point is left. In the implementation, the reference voltage of the comparator 27 is set to 0 (for example, the second input end of the comparator is grounded), such that it can be convenient to determine the phase of the synchronization signal.

Further, in embodiments of the present disclosure, there are many ways to determine whether the first pulsating waveform is at peak or falling edge based on the alternating signal and the reference voltage, which may be related to the cycle and phase of the alternating signal and the cycle and phase of the first pulsating waveform and similar to the methods illustrated in FIG. 11 and FIG. 12, and are not described herein in detail.

The method for obtaining the peak value of the first current with the first pulsating waveform is described above. In the following, the method for controlling the charging process based on the peak value of the first current with the first pulsating waveform will be described in detail with reference to specific embodiments.

Figure 14:
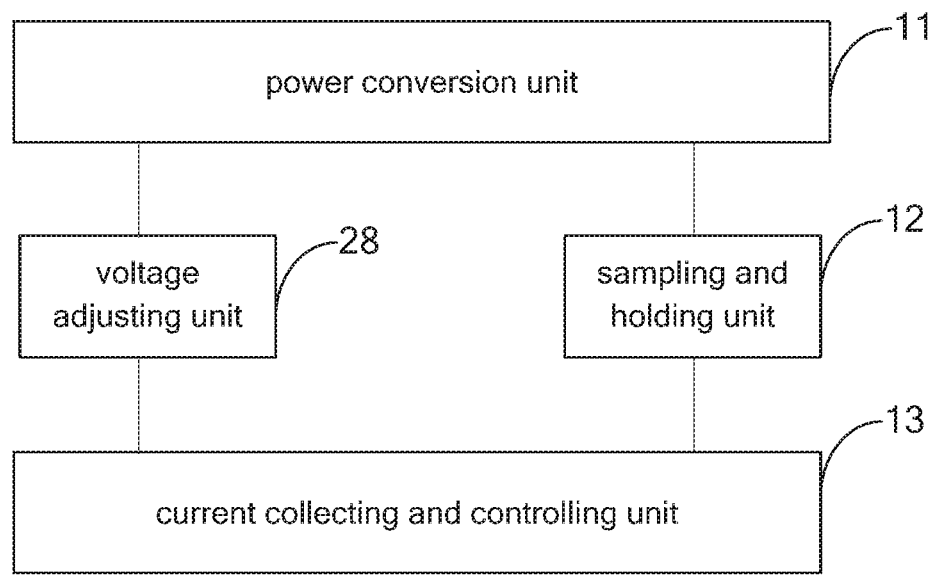
FIG. 14 is a schematic diagram illustrating a second adapter according to still yet another embodiment of the present disclosure.

In some embodiments, as illustrated in FIG. 14, the second adapter 10 may further include a voltage adjusting unit 28. The voltage adjusting unit 28 is coupled to the power conversion unit 11, and is configured to detect and adjust the output voltage of the second adapter 10. The current collecting and controlling unit 13 is coupled to the voltage adjusting unit 28, and configured to adjust the peak value of the first current with the first pulsating waveform via the voltage adjusting unit 28.

It should be understood that, a basic function of the voltage adjusting unit 28 is to adjust the output voltage of the second adapter. In detail, the voltage adjusting unit 28 can detect the output voltage of the second adapter 10 via the power conversion unit 11, and adjust the output voltage of the second adapter 10 via the power conversion unit 11. In other words, the voltage adjusting unit 28 and the power conversion unit 11 form a feedback control system of the output voltage of the second adapter 10, which can be called as a voltage feedback loop. It should be understood that, when the output power of the second adapter is ascertained, the current changes by adjusting the voltage. Thus, the current collecting and controlling unit 13 in embodiments of the present disclosure may utilize the voltage feedback loop to adjust the current after the peak value of the first current with the first pulsating waveform is sampled. For example, after the current collecting and controlling unit 13 samples the current peak value of the first current with the first pulsating waveform, when it is desired to adjust the current peak value to the target peak value, a target value of the output voltage of the second adapter 10 when the current peak value is adjusted to the target peak value can be calculated by software, and the output voltage of the second adapter 10 can be adjusted by the voltage feedback loop to the target value.

In embodiments of present disclosure, the current collecting and controlling unit 13 and the voltage feedback loop form the feedback control system of a peak value of the output current of the second adapter, which may be called as a current feedback loop. In other words, in embodiments of the present disclosure, the voltage feedback loop (implemented by hardware) and the current feedback loop (implemented by software based on the voltage feedback loop) are included, such that the second adapter can not only control the output voltage of the second adapter but also control the output current of the second adapter, thus enriching function of the second adapter and improving intelligence of the second adapter.

Figure 15:
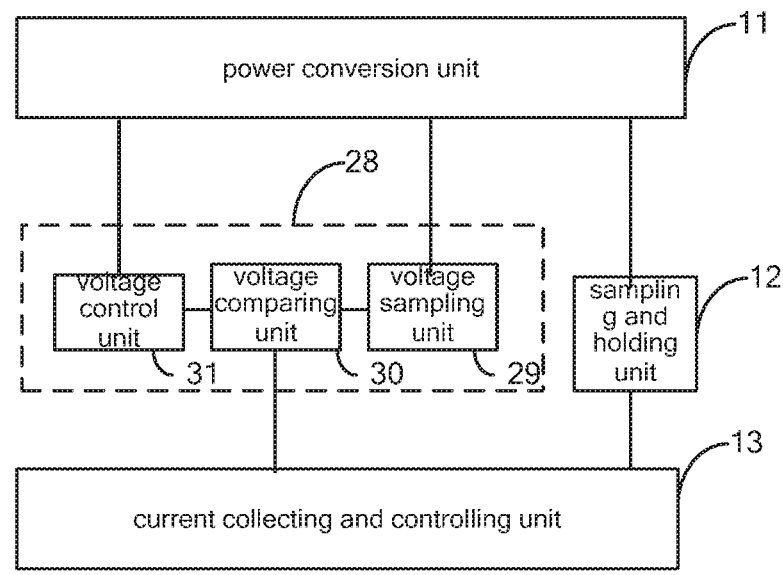
FIG. 15 is a schematic diagram illustrating a second adapter according to still yet another embodiment of the present disclosure.
Figure 17:
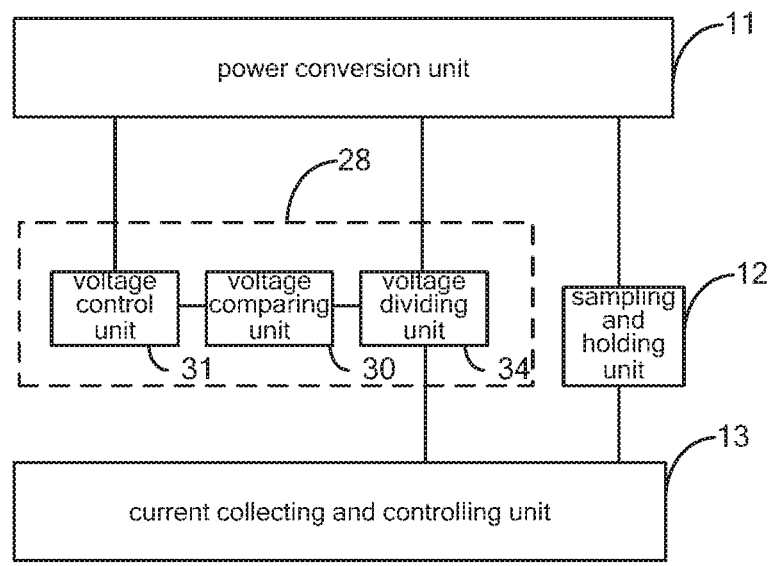
FIG. 17 is a schematic diagram illustrating a second adapter according to still yet another embodiment of the present disclosure.

There are many ways for adjusting by the current collecting and controlling unit 13 the peak value of the first current with the first pulsating waveform via the voltage adjusting unit 28, which may be described exemplary with reference to FIG. 15 and FIG. 17.

In some embodiments, as illustrated in FIG. 15, the voltage adjusting unit 28 may include a voltage sampling unit 29, a voltage comparing unit 30 and a voltage control unit 31. The voltage sampling unit 29 is coupled to the power conversion unit 11, and configured to sample the output voltage of the second adapter 10 to obtain a first voltage. An input end of the voltage comparing unit 30 is coupled to the voltage sampling unit 29. The voltage comparing unit 30 is configured to compare the first voltage and a first reference voltage. An input end of the voltage control unit 31 is coupled to an output end of the voltage comparing unit 30. An output end of the voltage control unit 31 is coupled to the power conversion unit 11. The voltage control unit 31 is configured to control the output voltage of the second adapter 11 according to a comparison result between the first voltage and the first reference voltage. The current collecting and controlling unit 13 is coupled to the voltage comparing unit 30, and configured to adjust the peak value of the first current with the first pulsating waveform by adjusting a value of the first reference voltage.

In detail, an input end of the voltage sampling unit 29 is coupled to a bus (VBUS) of the second adapter to sample the output voltage of the second adapter. In some embodiments, the voltage sampling unit 29 may be a wire. In this way, the first voltage sampled by the voltage sampling unit 29 is the output voltage of the second adapter. In other embodiments, the voltage sampling unit 29 may include two resistors for voltage division. In this way, the first voltage sampled by the voltage sampling unit 29 is a voltage obtained after the voltage division by two resistors. The voltage comparing unit 30 may be implemented by an operational amplifier. An input end of the operational amplifier is configured to receive the first voltage inputted by the voltage sampling unit 29. The other end of the operational amplifier is configured to receive the first reference voltage. An output end of the operational amplifier is configured to generate a voltage feedback signal for indicating whether the first voltage is equal to the first referent voltage. The voltage control unit 31 may be implemented by components such as an optical coupling unit and a PWM controller, and configured to adjust the output voltage of the second adapter based on the voltage feedback signal provided by the voltage comparing unit 30. When the output power of the second adapter is ascertained, the current collecting and controlling unit 13 may calculate an expectation of the output voltage of the second adapter based on an expectation of the peak value of the first current with the first pulsating waveform. By adjusting the value of the first reference voltage, the output voltage of the second adapter is adjusted to the expectation of the output voltage of the second adapter, such that the peak value of the first current with the first pulsating waveform is adjusted to the expectation of the peak value of the first current with the first pulsating waveform.

Figure 16:
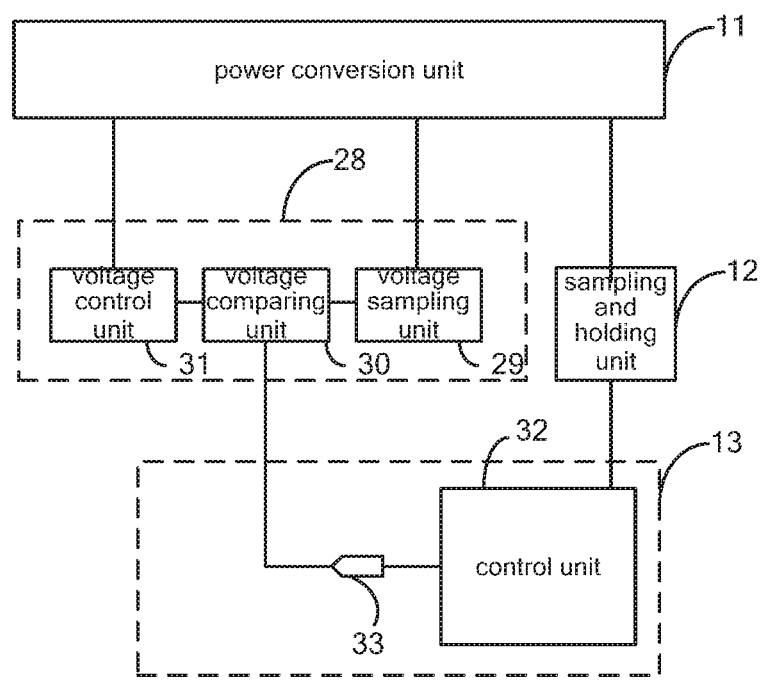
FIG. 16 is a schematic diagram illustrating the second adapter according to still yet another embodiment of the present disclosure.

The current collecting and controlling unit 13 may adjust the value of the first reference voltage in many ways. In an embodiment, as illustrated in FIG. 16, the current collecting and controlling unit 13 may include a first control unit 32 and a digital to analog converter (DAC) 33. An input end of the DAC 33 is coupled to the first control unit 32, an output end of the DAC 33 is coupled to the voltage comparing unit 30. The first control unit 32 adjusts the value of the first reference voltage via the DAC 33 to adjust the peak value of the first current with the first pulsating waveform. In another embodiment, the first control unit 32 may implement an adjustment of the value of the first reference voltage via a circuit, such as a RC unit and a digital potentiometer, which is not limited in embodiments of the present disclosure.

In some embodiments, as illustrated in FIG. 17, the voltage adjusting unit 28 may include a voltage division unit 34, a voltage comparing unit 30 and a voltage control unit 31. An input end of the voltage division unit 34 is coupled to the power conversion unit 11, and configured to perform voltage division on the output voltage of the second adapter 10 according to a predetermined division ratio, to generate a second voltage. An input end of the voltage comparing unit 30 is coupled to an output end of the voltage division unit 34, and configured to compare the second voltage with a second reference voltage. An input end of the voltage control unit 31 is coupled to an input of the voltage comparing unit 30. An output end of the voltage control unit 31 is coupled to the power conversion unit 11. The voltage control unit 31 is configured to control the output voltage of the second adapter 10 according to a comparison result between the second voltage and the second reference voltage. The current collecting and controlling unit 13 is coupled to the voltage comparing unit 30, and configured to adjust the peak value of the first current with the first pulsating waveform by adjusting the division ratio.

The embodiments of the present disclosure are similar to an embodiment illustrated in FIG. 15. The difference is that, a division unit is incorporated in embodiments of the present disclosure. The division ratio of the division unit is adjustable. Further, the current collecting and controlling unit 13 in embodiments of the present disclosure adjusts the peak value of the first current with the first pulsating waveform by adjusting the division ratio of the division unit 34 rather than adjusting the reference voltage of the voltage comparing unit 30. In embodiments of the present disclosure, based on the division unit, not only the sampling of the output voltage of the second adapter may be realized, but also the adjustment of the peak value of the first current with the first pulsating waveform can be realized, thus simplifying circuit structure of the second adapter.

It should be understood that, since the adjustment of the peak value of the first current with the first pulsating waveform may be realized by adjusting the division ratio of the division unit. Thus, the reference voltage (i.e., the second reference voltage) of the voltage comparing unit in embodiments of the present disclosure is a fixed value.

There are many ways to implement the division unit 34 in embodiments of the present disclosure. For example, functions of voltage division and division ratio adjustment may be implemented by a digital potentiometer, or by a component such as a discrete resistor or switch, etc.

Figure 18:
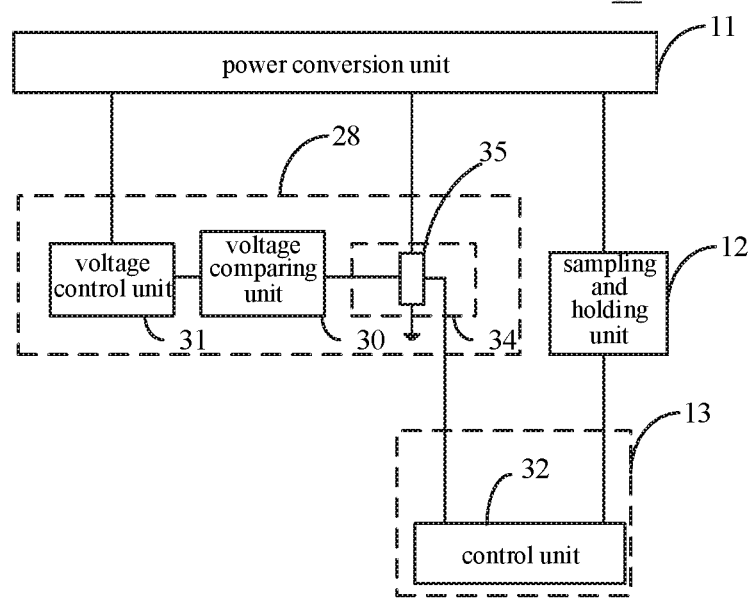
FIG. 18 is a schematic diagram illustrating a second adapter according to still yet another embodiment of the present disclosure.

For example, the functions are implemented by the digital potentiometer. As illustrated in FIG. 18, the current collecting and controlling unit 13 includes a first control unit 32. The division unit 34 includes the digital potentiometer 35. A high level end of the digital potentiometer 35 is coupled to the power conversion unit 11. A low level end of the digital potentiometer 35 is coupled to the voltage comparing unit 30. The first control unit 32 is couple to a control end of the digital potentiometer 35, and configured to adjust the peak value of the first current with the first pulsating waveform by adjusting the division ratio of the digital potentiometer 35 via the control end of the digital potentiometer 35.

In some embodiments, the second adapter 10 may be configured to support a first charging mode and a second charging mode. A charging speed at which the second adapter 10 charges the device to be charged (such as the terminal) in the second charging mode is faster than a charging speed at which the second adapter 10 charges the device to be charged (such as the terminal) in the first charging mode (the above mentioned first current with the first pulsating waveform may be the output current of the second adapter in the second charging mode). In other words, compared to the second adapter 10 working in the first charging mode, the second adapter 10 working in the second charging mode can fully charge the battery having the same capacity in the device to be charged (such as the terminal) in a shorter time period.

The second adapter 10 includes a control unit. When the second adapter 10 is coupled to the device to be charged (such as the terminal), the control unit performs bidirectional communication with the device to be charged (such as the terminal) to control the charging process in the second charging mode. The control unit may be any of the control units described in embodiments. For example, the control unit may be a control unit in the first adjusting unit, or may be a control unit in the second adjusting unit.

The first charging mode is a normal charging mode and the second charging mode is a fast charging mode. Under the normal charging mode, the second adapter outputs a relatively small current (typically less than 2.5 A) or charges the battery in the device to be charged (such as the terminal) with a relatively small power (typically less than 15 W). In the normal charging mode, it may take several hours to fully charge a larger capacity battery (such as a battery with 3000 mAh). In contrast, under the fast charging mode, the second adapter outputs a relatively large current (typically greater than 2.5 A, such as 4.5 A, 5 A or higher) or charges the battery in the device to be charged (such as the terminal) with a relatively large power (typically greater than or equal to 15 W). Compared to the normal charging mode, the charging speed of the second adapter in the fast charging mode is faster, and the charging time required for fully charging a battery with a same capacity in the fast charging mode may be significantly shortened.

The communicated content between the control unit of the second adapter and the device to be charged (such as the terminal) is not limited in embodiments of the present disclosure, and the control method of the control unit on the output of the second adapter in the second charging mode is also not limited in embodiments of the present disclosure. For example, the control unit may communicate with the device to be charged (such as the terminal) to obtain the present voltage or present electric quantity of the battery in the device to be charged (such as the terminal), and adjust the output voltage or output current of the second adapter based on the present voltage or present electric quantity of the battery. In the following, the communicated content between the control unit and the device to be charged (such as the terminal) and the control method of the control unit on the output of the second adapter in the second charging mode will be described in detail in combination with specific embodiments.

In some embodiments, the control unit performs the bidirectional communication with the device to be charged (such as the terminal) to control the output of the second adapter in the second charging mode as follows. The control unit performs the bidirectional communication with the device to be charged (such as the terminal) to negotiate the charging mode between the second adapter and the device to be charged (such as the terminal).

In embodiments of the present disclosure, the second adapter does not perform a fast charging on the device to be charged (such as the terminal) in the second charging mode blindly, but performs the bidirectional communication with the device to be charged (such as the terminal) to negotiate whether the second adapter can perform the fast charging on the device to be charged (such as the terminal) in the second charging mode. In this way, safety of charging process can be improved.

In detail, the control unit performs the bidirectional communication with the device to be charged (such as the terminal) to negotiate the charging mode between the second adapter and the device to be charged (such as the terminal) as follows. The control unit sends a first instruction to the device to be charged (such as the terminal), in which the first instruction is configured to query the device to be charged (such as the terminal) whether to start the second charging mode. The control unit receives a first reply instruction for responding to the first instruction sent by the device to be charged (such as the terminal), in which the first reply instruction is configured to indicate whether the device to be charged (such as the terminal) agrees to start the second charging mode. When the device to be charged (such as the terminal) agrees to start the second charging mode, the control unit charges the device to be charged (such as the terminal) in the second charging mode.

The master-slave relation of the second adapter (or the control unit in the second adapter) and the device to be charged (such as the terminal) is not limited in embodiments of the present disclosure. In other words, any of the control unit and the device to be charged (such as the terminal) can be configured as the master device for initiating the bidirectional communication session, accordingly, the other one can be configured as the slave device for making a first response or a first reply to the communication initiated by the master device. As a feasible implementation, during the communication, the identifications of the master device and the slave device can be determined by comparing the electrical levels of the second adapter and the device to be charged (such as the terminal) relative to the ground.

The specific implementation of bidirectional communication between the second adapter (or the control unit in the second adapter) and the device to be charged (such as the terminal) is not limited in embodiments of the present disclosure. In other words, any of the second adapter (or the control unit in the second adapter) and the device to be charged (such as the terminal) can be configured as the master device for initiating the bidirectional communication session, accordingly, the other one can be configured as the slave device making a first response or a first reply to the communication initiated by the master device, and the master device is able to make a second response to the first response or the first reply of the slave device, and thus a negotiation about a charging mode can be realized between the master device and the slave device. As a feasible implementation, a charging operation between the master device and the slave device is performed after a plurality of negotiations about the charging mode are completed between the master device and the slave device, such that the charging process can be performed safely and reliably after the negotiation.

As an implementation, the master device is able to make a second response to the first response or the first reply made by the slave device to the communication session in a manner that, the master device is able to receive the first response or the first reply made by the slave device to the communication session and to make a targeted second response to the first response or the first reply. As an example, when the master device receives the first response or the first reply made by the slave device to the communication session in a predetermined time period, the master device makes the targeted second response to the first response or the first reply of the slave device in a manner that, the master device and the slave device complete one negotiation about the charging mode, and a charging process may be performed between the master device and the salve device in the first charging mode or the second charging mode, i.e., the second adapter charges the device to be charged (such as the terminal) in the first charging mode or the second charging mode according to a negotiation result.

As another implementation, the master device is able to make a second response to the first response or the first reply made by the slave device to the communication session in a manner that, when the master device does not receive the first response or the first reply made by the slave device to the communication session in the predetermined time period, the master device also makes the targeted second response to the first response or the first reply of the slave device. As an example, when the master device does not receive the first response or the first reply made by the slave device to the communication session in the predetermined time period, the master device makes the targeted second response to the first response or the first reply of the slave device in a manner that, the master device and the slave device complete one negotiation about the charging mode, the charging process is performed between the master device and the slave device in the first charging mode, i.e., the second adapter charges the device to be charged (such as the terminal) in the first charging mode.

In some embodiments, when the device to be charged (such as the terminal) is configured as the master device for initiating the communication session, after the second adapter (or the control unit in the second adapter) configured as the slave device makes the first response or the first reply to the communication session initiated by the master device, it is unnecessary for the device to be charged (such as the terminal) to make the targeted second response to the first response or the first reply of the second adapter, i.e., one negotiation about the charging mode is regarded as completed between the second adapter (or the control unit in the second adapter) and the device to be charged (such as the terminal), and the second adapter is able to charge the device to be charged (such as the terminal) in the first charging mode or the second charging mode according to the negotiation result.

In some embodiments, the control unit performs the bidirectional communication with the device to be charged (such as the terminal) to control the output of the second adapter in the second charging mode as follows. The control unit performs the bidirectional communication with the device to be charged (such as the terminal) to determine charging voltage outputted by the second adapter in the second charging mode for charging the device to be charged (such as the terminal). The control unit adjusts the output voltage of the second adapter, such that the output voltage of the second adapter is equal to the charging voltage outputted by the second adapter in the second charging mode for charging the device to be charged (such as the terminal).

In detail, the control unit performs the bidirectional communication with the device to be charged (such as the terminal) to determine the charging voltage outputted by the adapter in the second charging mode for charging the device to be charged (such as the terminal) as follows. The control unit sends a second instruction to the device to be charged (such as the terminal), in which the second instruction is configured to query whether the output voltage of the second adapter is suitable for the current total voltage of the battery of the device to be charged (such as the terminal). The control unit receives a second reply instruction sent by the device to be charged (such as the terminal), in which the second reply instruction is configured to indicate that the output voltage of the second adapter is suitable, high or low. In another embodiment, the second instruction can be configured to query whether the present output voltage of the second adapter is suitable for being used as the charging voltage outputted by the second adapter in the second charging mode for charging the device to be charged (such as the terminal), and the second reply instruction can be configured to indicate the present output voltage of the second adapter is suitable, high or low. When the present output voltage of the second adapter is suitable for the present total voltage of the battery or the present output voltage of the second adapter is suitable for being used as the charging voltage outputted by the second adapter in the second charging mode for charging the device to be charged (such as the terminal), it indicates that the present output voltage of the second adapter is slightly higher than the present total voltage of the battery, and a difference between the output voltage of the second adapter and the present total voltage of the battery is within the predetermined range (typically in an order of hundreds of millivolts).

In some embodiments, the control unit may perform the bidirectional communication with the device to be charged (such as the terminal) to control the charging process that the second adapter outputs in the second charging mode as follows. The control unit performs the bidirectional communication with the device to be charged (such as the terminal) to determine the charging current outputted by the second adapter in the second charging mode for charging the device to be charged (such as the terminal). The control unit adjusts the peak value of the first current with the first pulsating waveform, such that the peak value of the first current with the first pulsating waveform is equal to the charging current outputted by the second adapter in the second charging mode for charging the device to be charged (such as the terminal).

In detail, the control unit performs the bidirectional communication with the device to be charged (such as the terminal) to determine the charging current outputted by the second adapter in the second charging mode for charging the device to be charged (such as the terminal) as follows. The control unit sends a third instruction to the device to be charged (such as the terminal), in which the third instruction is configured to query a maximum charging current presently supported by the device to be charged (such as the terminal). The control unit receives a third reply instruction sent by the device to be charged (such as the terminal), in which the third reply instruction is configured to indicate the maximum charging current presently supported by the device to be charged (such as the terminal). The device to be charged (such as the terminal) determines the charging current outputted by the adapter in the second charging mode for charging the device to be charged (such as the terminal) based on the maximum charging current presently supported by the device to be charged (such as the terminal). It should be understood that, the control unit can determine the charging current outputted by the second adapter in the second charging mode for charging the device to be charged (such as the terminal) based on the maximum charging current presently supported by the device to be charged in many ways. For example, the second adapter can determine the maximum charging current presently supported by the device to be charged (such as the terminal) as the charging current outputted by the second adapter in the second charging mode for charging the device to be charged, or can determine the charging current outputted by the second adapter in the second charging mode for charging the device to be charged (such as the terminal) after comprehensively considering the maximum charging current presently supported by the device to be charged (such as the terminal) and its own current output capability.

In some embodiments, the control unit may perform the bidirectional communication with the device to be charged (such as the terminal) to control the output of the second adapter in the second charging mode as follows. During a charging process that the second adapter charges the device to be charged (such as the terminal) in the second charging mode, the control unit performs the bidirectional communication with the device to be charged (such as the terminal) to adjust the peak value of the first current with the first pulsating waveform.

In detail, the control unit performs the bidirectional communication with the device to be charged (such as the terminal) to adjust the peak value of the first current with the first pulsating waveform as follows. The control unit sends a fourth instruction to the device to be charged (such as the terminal), in which the fourth instruction is configured to query a present voltage of the battery in the device to be charged (such as the terminal). The control unit receives a fourth reply instruction sent by the device to be charged (such as the terminal), in which the fourth reply instruction is configured to indicate the present voltage of the battery. The control unit adjusts the peak value of the first current with the first pulsating waveform according to the present voltage of the battery.

In some embodiments, as illustrated in FIG. 19A, the second adapter 10 includes a charging interface 191. Further, in some embodiments, the control unit (such as MCU illustrated in FIG. 21) in the second adapter 10 can perform the bidirectional communication with the device to be charged (such as the terminal) via a data wire 192 in the charging interface 191.

In some embodiments, the control unit may perform the bidirectional communication with the device to be charged (such as the terminal) to control the output of the second adapter in the second charging mode as follows. The control unit performs the bidirectional communication with the device to be charged (such as the terminal) to determine whether there is a poor contact in the charging interface.

In detail, the control unit performs the bidirectional communication with the device to be charged (such as the terminal) to determine whether there is the poor contact in the charging interface as follows. The control unit sends a fourth instruction to the device to be charged (such as the terminal), in which the fourth instruction is configured to query a present voltage of the battery in the device to be charged (such as the terminal). The control unit receives a fourth reply instruction sent by the device to be charged (such as the terminal), in which the fourth reply instruction is configured to indicate the present voltage of the battery. The control unit determines whether there is the poor contact in the charging interface according to the output voltage of the second adapter and the present voltage of the battery in the device to be charged (such as the terminal). For example, when the control unit determines a difference between the output voltage of the second adapter and the present voltage of the battery in the device to be charged (such as the terminal) is greater than a predetermined voltage threshold, it indicates that an impedance obtained by dividing the value of the output current of the second adapter by the difference is greater than an impedance threshold, such that it can be determined that there is the poor contact in the charging interface.

In some embodiments, it can be determined by the device to be charged (such as the terminal) whether there is the poor contact in the charging interface. The device to be charged (such as the terminal) sends a sixth instruction to the control unit, in which the sixth instruction is configured to query the output voltage of the second adapter. The device to be charged (such as the terminal) receives a sixth reply instruction, in which the sixth reply instruction is configured to indicate the output voltage of the second adapter. The device to be charged (such as the terminal) determines whether there is the poor contact in the charging interface according to the output voltage of the second adapter and the present voltage of the battery in the device to be charged (such as the terminal). After the device to be charged (such as the terminal) determines that there is the poor contact in the charging interface, the device to be charged (such as the terminal) sends a fifth instruction to the control unit, in which the fifth instruction is configured to indicate that there is the poor contact in the charging interface. After receiving the fifth instruction, the control unit can control the second adapter to quit the second charging mode.

Figure 19B:
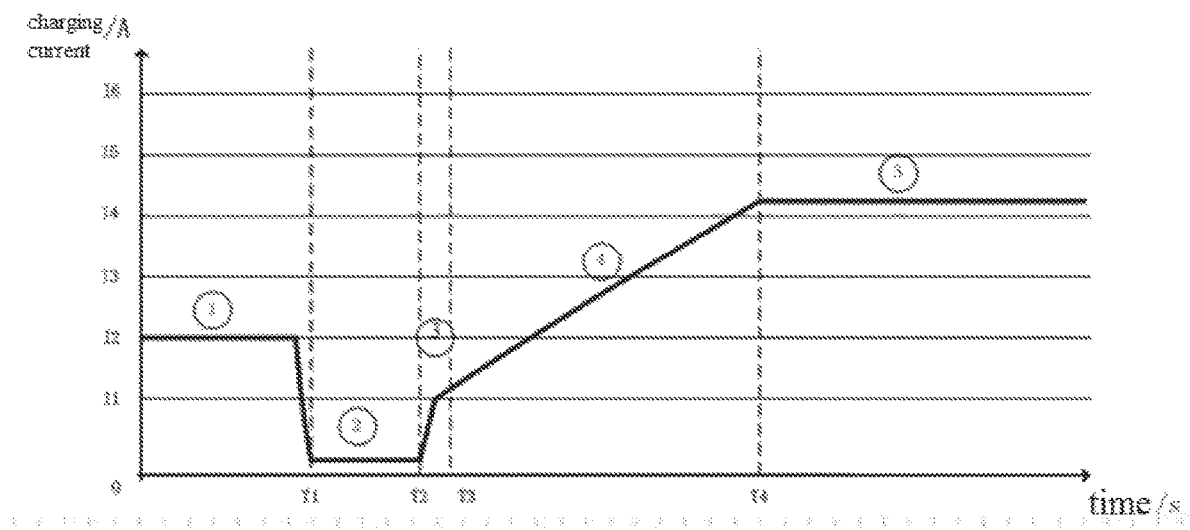
FIG. 19B is a schematic diagram illustrating a fast charging communication according to an embodiment of the present disclosure.

As illustrated in FIG. 19B, the communication procedure between the control unit in the second adapter and the device to be charged (such as the terminal) will be described in detail. It should be noted that, examples in FIG. 19B are merely used to help those skilled in the related art to understand embodiments of the present disclosure. The embodiments shall not be limited to the specific numeric values or specific scenes. Apparently, various modifications and equivalents can be made by those skilled in the related art based on examples in FIG. 19B, and those modifications and equivalents shall fall within the protection scope of the present disclosure.

As illustrated in FIG. 19B, the charging process that the second adapter charges the device to be charged (such as the terminal) in the second charging mode may include the following five stages.

Stage 1:

After the device to be charged (such as the terminal) is coupled to a power supply providing device, the device to be charged (such as the terminal) may detect a type of the power supply providing device via the data wires D+ and D−. When detecting that the power supply providing device is the second adapter, the device to be charged (such as the terminal) may absorb current greater than a predetermined current threshold I2, such as 1 A. When the control unit in the second adapter detects that current outputted by the second adapter is greater than or equal to I2 within a predetermined time period (such as a continuous time period T1), the control unit determines that the device to be charged (such as the terminal) has completed the recognition of the type of the power supply providing device. The control unit initiates a negotiation between the second adapter and the device to be charged (such as the terminal), and sends an instruction 1 (corresponding to the above-mentioned first instruction) to the device to be charged (such as the terminal) to query whether the device to be charged (such as the terminal) agrees that the second adapter charges the device to be charged (such as the terminal) in the second charging mode.

When the control unit receives a reply instruction from the device to be charged (such as the terminal) and the reply instruction indicates that the device to be charged (such as the terminal) disagrees that the second adapter charges the device to be charged (such as the terminal) in the second charging mode, the control unit detects the output current of the second adapter again. When the output current of the second adapter is still greater than or equal to I2 within a predetermined continuous time period (such as a continuous time period T1), the control unit sends the instruction 1 again to the device to be charged (such as the terminal) to query whether device to be charged (such as the terminal) agrees that the second adapter charges the device to be charged (such as the terminal) in the second charging mode. The control unit repeats the above actions in stage 1, until the device to be charged (such as the terminal) agrees that the second adapter charges the device to be charged (such as the terminal) in the second charging mode or the output current of the second adapter is no longer greater than or equal to I2.

After the device to be charged (such as the terminal) agrees the second adapter charges the device to be charged (such as the terminal) in the second charging mode, the communication procedure goes into stage 2.

Stage 2:

For the output voltage of the second adapter, there may be several levels. The control unit sends an instruction 2 (corresponding to the above-mentioned second instruction) to the device to be charged (such as the terminal) to query whether the output voltage of the second adapter is suitable for the present voltage of the battery in the device to be charged (such as the terminal).

The device to be charged (such as the terminal) sends a reply instruction of the instruction 2 to the control unit, for indicating that the output voltage of the second adapter is higher, lower or suitable for the present voltage of the battery in the device to be charged (such as the terminal) to the second adapter. When the reply instruction of the instruction 2 indicates that the output voltage of the second adapter is higher, or lower, the control unit adjusts the output voltage of the second adapter by one level, and sends the instruction 2 to the device to be charged (such as the terminal) again to query whether the output voltage of the second adapter is suitable for the present voltage of the battery (such as the terminal). The above actions in stage 2 are repeated, until the device to be charged (such as the terminal) determines that the output voltage of the second adapter is suitable for the present voltage of the battery (such as the terminal). Then, the communication procedure goes into stage 3.

Stage 3:

The control unit sends an instruction 3 (corresponding to the above-mentioned third instruction) to the device to be charged (such as the terminal) to query the maximum charging current presently supported by the device to be charged (such as the terminal). The device to be charged (such as the terminal) sends a reply instruction of the instruction 3 to the control unit for indicating the maximum charging current presently supported by the device to be charged (such as the terminal), and then the communication procedure goes into stage 4.

Stage 4:

The control unit determines the charging current outputted by the second adapter in the second charging mode for charging the device to be charged (such as the terminal), according to the maximum charging current presently supported by the device to be charged (such as the terminal). Then, the communication procedure goes into stage 5, i.e., the constant current charging stage.

Stage 5:

When the communication procedure goes into the constant current charging stage, the control unit sends an instruction 4 (corresponding to the above-mentioned fourth instruction) to the device to be charged (such as the terminal) at intervals to query the present voltage of the battery in the device to be charged (such as the terminal). The device to be charged (such as the terminal) may send a reply instruction of the instruction 4 to the control unit, to feedback the present voltage of the battery in the device to be charged (such as the terminal). The control unit may determine according to the present voltage of the battery in the device to be charged (such as the terminal) whether there is the poor contact in the charging interface and whether it is necessary to decrease the peak value of the first current with the first pulsating waveform. When the second adapter determines that there is the poor contact in the charging interface, the second adapter sends an instruction 5 (corresponding to the above-mentioned fifth instruction) to the device to be charged (such as the terminal), and the second adapter quits the second charging mode and then the communication procedure is reset and goes into stage 1 again.

In some embodiments of the present disclosure, in stage 1, when the device to be charged (such as the terminal) sends the reply instruction of the instruction 1, the reply instruction of the instruction 1 may carry data (or information) on the path impedance of the device to be charged (such as the terminal). The data on the path impedance of the device to be charged (such as the terminal) may be used in stage 5 to determine whether there is the poor contact in the charging interface.

In some embodiments of the present disclosure, in stage 2, the time period from when the device to be charged (such as the terminal) agrees that the second adapter charges the device to be charged (such as the terminal) in the second charging mode to when the control unit adjusts the output voltage of the second adapter to a suitable value, may be controlled in a certain range. If the time period exceeds a predetermined range, the second adapter or the device to be charged (such as the terminal) may determine that the fast charging communication procedure is abnormal, and is reset and goes into stage 1.

In some embodiments, in stage 2, when the output voltage of the second adapter is higher than the present voltage of the battery in the device to be charged (such as the terminal) by $\Delta V$ ($\Delta V$ may be set to 200-500 mV), the device to be charged (such as the terminal) may send a reply instruction of the instruction 2 to the control unit, for indicating that the output voltage of the second adapter is suitable for the voltage of the battery in the device to be charged (such as the terminal).

In some embodiments of the present disclosure, in stage 4, the adjusting speed of the output current of the second adapter may be controlled to be in a certain range, thus avoiding an abnormity occurring in the charging process that the second adapter charges the device to be charged (such as the terminal) in the second charging mode due to the too fast adjusting speed.

In some embodiments of the present disclosure, in stage 5, the variation degree of the output current of the second adapter may be controlled to be within 5%.

In some embodiments of the present disclosure, in stage 5, the control unit can monitor the path impedance of a charging loop in real time. In detail, the control unit can monitor the path impedance of the charging loop according to the output voltage of the second adapter, the output current of the second adapter and the present voltage of the battery fed back by the device to be charged (such as the terminal). When the path impedance of the charging loop is greater than a sum of the path impedance of the device to be charged (such as the terminal) and the impedance of the charging wire, it may be considered that there is the poor contact in the charging interface, and thus the second adapter stops charging the device to be charged (such as the terminal) in the second charging mode.

In some embodiments of the present disclosure, after the second adapter starts to charge the device to be charged (such as the terminal) in the second charging mode, time interval of communications between the control unit and the device to be charged (such as the terminal) may be controlled to be in a certain range, thus avoiding abnormity in the communication procedure due to the too short time interval of communications.

In some embodiments of the present disclosure, the termination of the charging process (or the termination of the charging process that the second adapter charges the device to be charged (such as the terminal) in the second charging mode) may be a recoverable termination or an unrecoverable termination.

For example, when it is detected that the battery in the device to be charged (such as the terminal) is fully charged or there is the poor contact in the charging interface, the charging process is stopped and the charging communication procedure is reset, and the charging process goes into stage 1 again. When the device to be charged (such as the terminal) disagrees that the second adapter charges the device to be charged (such as the terminal) in the second charging mode, the communication procedure would not go into stage 2. The termination of the charging process in such a case may be considered as an unrecoverable termination.

For another example, when an abnormity occurs in the communication between the control unit and the device to be charged (such as the terminal), the charging process is stopped and the charging communication procedure is reset, and the charging process goes into stage 1 again. After requirements for stage 1 are met, the device to be charged (such as the terminal) agrees that the second adapter charges the device to be charged (such as the terminal) in the second charging mode to recover the charging process. In this case, the termination of the charging process may be considered as a recoverable termination.

For another example, when the device to be charged (such as the terminal) detects that an abnormity occurs in the battery, the charging process is stopped and the charging communication process is reset, and the charging process goes into stage 1 again. The device to be charged (such as the terminal) disagrees that the second adapter charges the device to be charged (such as the terminal) in the second charging mode. When the battery returns to normal and the requirements for stage 1 are met, the device to be charged (such as the terminal) agrees that the second adapter charges the device to be charged (such as the terminal) in the second charging mode. In this case, the termination of fast charging process may be considered as a recoverable termination.

Communication actions or operations illustrated in FIG. 19B are merely exemplary. For example, in stage 1, after the device to be charged (such as the terminal) is coupled to the second adapter, the handshake communication between the device to be charged (such as the terminal) and the control unit may be initiated by the device to be charged (such as the terminal). In other words, the device to be charged (such as the terminal) sends an instruction 1 to query the control unit whether to start the second charging mode. When the device to be charged (such as the terminal) receives a reply instruction indicating that the second adapter agrees to charge the device to be charged (such as the terminal) in the second charging mode from the control unit, the second adapter starts to charge the battery in the device to be charged (such as the terminal) in the second charging mode.

For another example, after stage 5, there may be a constant voltage charging stage. In detail, in stage 5, the device to be charged (such as the terminal) may feedback the present voltage of the battery to the control unit. The charging process goes into the constant voltage charging stage from the constant current charging stage when the present voltage of the battery reaches a voltage threshold for constant voltage charging. During the constant current charging stage, the charging current decreases gradually. When the current reduces to a certain threshold, the charging process is stopped, and it indicates that the battery in the device to be charged (such as the terminal) is fully charged.

Figure 20:
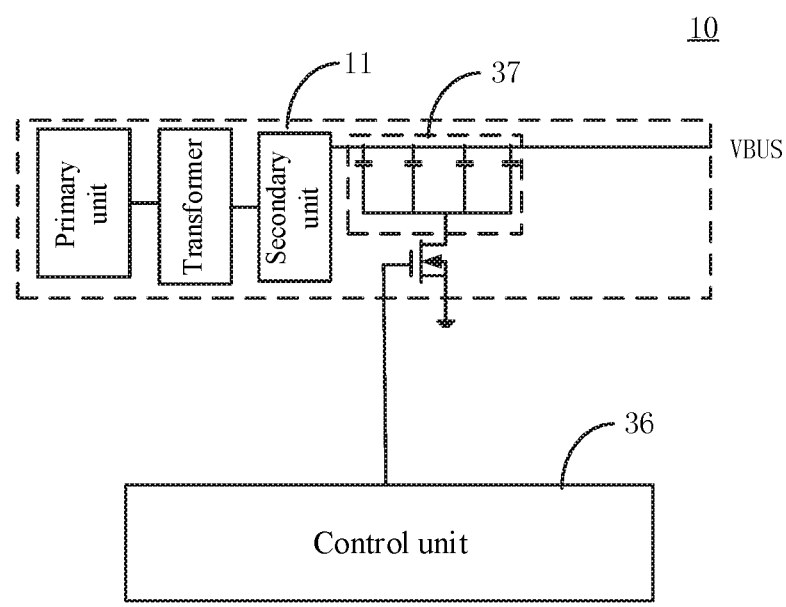
FIG. 20 is a schematic diagram illustrating a second adapter according to still yet another embodiment of the present disclosure.

Further, as illustrated in FIG. 20, based on any of the above-mentioned embodiments, the second adapter 10 may support the first charging mode and the second charging mode. The charging speed at which the second adapter charges the device to be charged (such as the terminal) in the second charging mode is faster than the charging speed at which second adapter charges the device to be charged (such as the terminal) in the first charging mode. The power conversion unit 11 may include a secondary filtering unit 37. The second adapter 10 may include a control unit 36 coupled to the secondary filtering unit 37. In the first charging mode, the control unit 36 controls the secondary filter unit 37 to work, such that the value of the output voltage of the second adapter 10 is constant. In the second charging mode, the control unit 36 controls the secondary filter unit 37 to stop working, such that the output current of the second adapter 10 is the first current with the first pulsating waveform.

In embodiments of the present disclosure, the control unit may control an operation of the secondary filtering unit, such that the second adapter not only can output normal direct current with the constant value, but also can output pulsating direct current with the changing value, thus realizing compatibility with the charging mode in the related art.

In some embodiments, the second adapter may directly apply the first current with the first pulsating waveform to two ends of the battery in the device to be charged (such as the terminal) for performing direct charging on the battery.

In detail, the direct charging refers to that, the output voltage and the output current of the second adapter are directly applied to (or directed to) two ends of the battery in the device to be charged (such as the terminal) for charging the battery in the device to be charged (such as the terminal), and it is unnecessary to provide a conversion circuit to convert the output current or the output voltage of the second adapter, thus avoiding energy loss during the conversion. During the charging process in the second charging mode, in order to be able to adjust the charging voltage or the charging current on the charging circuit, the second adapter may be designed as an intelligent adapter, and the second adapter realizes the conversion of the charging voltage or the charging current, thus relieving burden of the device to be charged (such as the terminal) and reducing heat generated in the device to be charged.

In embodiments of the present disclosure, the second adapter 10 may work in a constant current mode. The constant current mode herein means a charging mode in which the output current of the second adapter is controlled, while it is not required to keep the output current of the second adapter constant. In practice, the second adapter typically adopts a multi-stage constant current mode for charging during the constant current charging mode.

The multi-stage constant current charging may include N charging stages, where N is an integer no less than 2. The first charging stage of the multi-stage constant current charging starts with predetermined charging current. N constant charging stages in the multi-stage constant current charging are performed in sequence from the first charging stage to the $(N-1)^{th}$ charging stage. After the charging stage is switched from one charging stage to a next charging stage, the value of the charging current may be decreased. When the battery voltage reaches a charging stop voltage threshold, the charging stage is switched from the present charging stage to the next charging stage.

Further, when the output current of the second adapter is the pulsating direct current, the constant current mode may mean a charging mode in which the peak value or mean value of the pulsating direct current is controlled, i.e., the peak value of the output current of the second adapter does not exceed a current value corresponding to the constant current mode.

Figure 22:
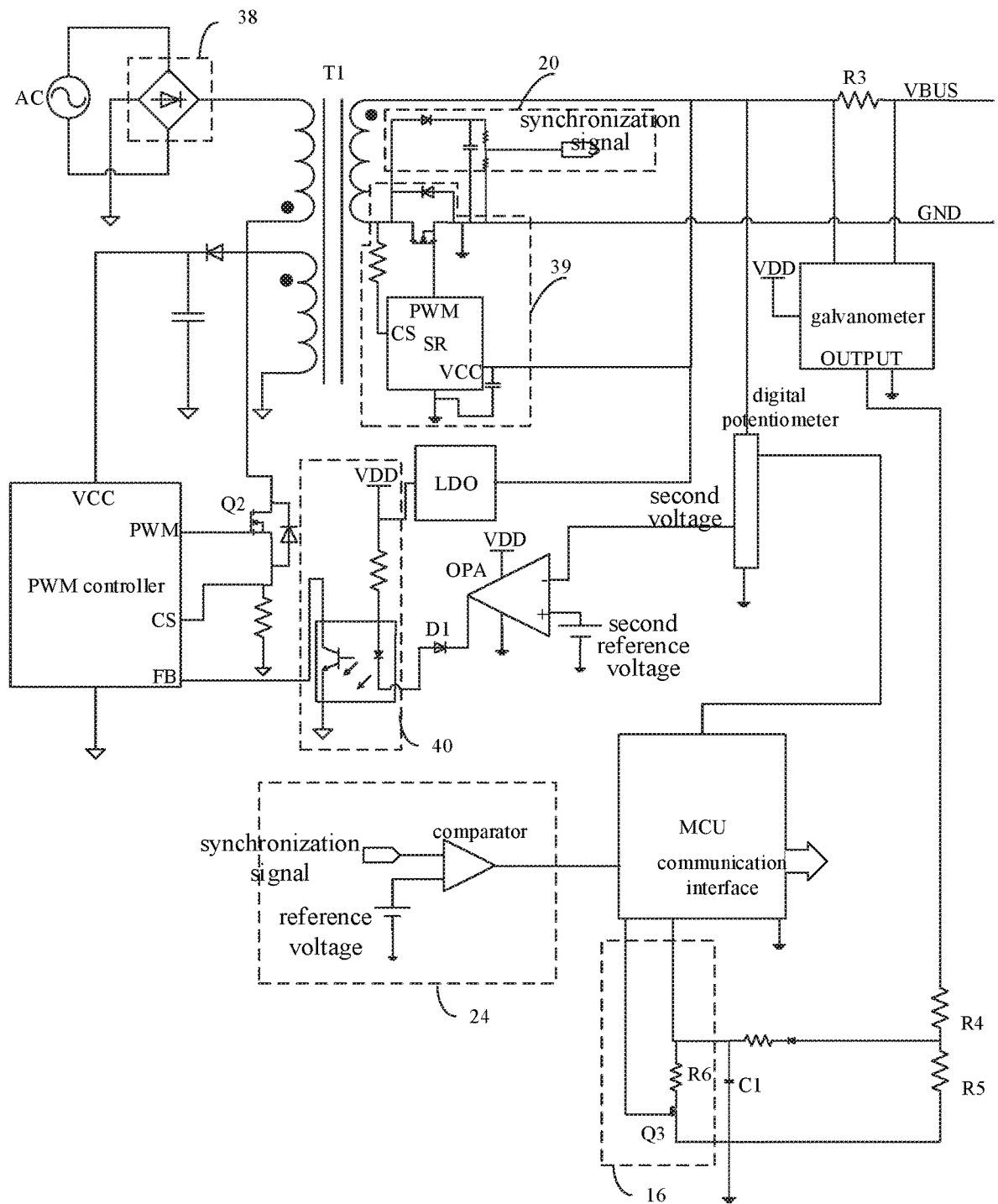
FIG. 22 is a circuit schematic diagram illustrating a second adapter according to another embodiment of the present disclosure.

The embodiments of the present disclosure will be described in detail with reference to specific examples. It should be noted that, examples illustrated in FIG. 21 and FIG. 22 are merely used to help those skilled in the related art to understand the embodiments of the present disclosure, rather than to limit the embodiments of the present disclosure to the illustrated specific numeric values or specific scenes. Apparently, various modifications and equivalents can be made by those skilled in the related art based on examples in FIG. 21 and FIG. 22, and those modifications and equivalents shall fall within the protection scope of the present disclosure.

The second adapter includes the power conversion unit (corresponding to the above-mentioned power conversion unit 11). As illustrated in FIG. 21, the power conversion unit may include an input end of the alternating current AC, a primary rectifying unit 38, a transformer T1, a secondary rectifying unit 39 and a first rectifying unit 20.

In detail, the input end of the alternating current introduces mains supply (typically alternating current of 220V), and the mains supply is transmitted to the primary rectifying unit 38.

The primary rectifying unit 38 is configured to convert the mains supply to second current with second pulsating waveform, and the second current is transmitted to the transformer T1. The primary rectifying unit 38 may be a bridge rectifying unit, such as a full-bridge rectifying unit illustrated in FIG. 21, or may be a half-bridge rectifying unit, which is not limited herein.

The transformer T1 is configured to couple the second pulsating direct current from a primary side of the transformer T1 to a secondary side of the transformer T1. The transformer T1 may be a normal transformer, or may be a high-frequency transformer of which a working frequency ranges from 50 KHz to 2 MHz. The number and connections of primary windings of the transformer T1 are related to a type of a switching power supply used in the second adapter, which are not limited herein. As illustrated in FIG. 21, the second adapter may adopt a flyback switching power supply. An end of the primary winding of the transformer is coupled to the primary rectifying unit 38, and the other end of the primary winding is coupled to a switch controlled by a PWM controller. Certainly, the second adapter may also adopt a forward switching power supply or a push-pull switching power supply. The primary rectifying unit and the transformer in switching power supplies with different type may have respective connections, which will be not described for simplicity.

The secondary rectifying unit 39 is configured to rectify current coupled from the primary side to the secondary side, to obtain the first current with the first pulsating waveform. The secondary rectifying unit 39 may be implemented in many types. FIG. 21 illustrates a typical type of secondary synchronous rectifying unit. The secondary synchronous rectifying unit includes a synchronous rectifier (SR) chip, a metal oxide semiconductor (MOS) transistor controlled by the SR chip, and a diode coupled to a source electrode and a drain electrode of the MOS transistor. The SR chip sends a PWM control signal to a grid electrode of the MOS transistor, to control the MOS transistor to switch on or off, thus realizing a synchronous rectifying at the secondary side.

The first rectifying unit 20 is configured to rectify the current coupled from the primary side to the secondary side, to obtain a synchronization signal. As illustrated in FIG. 21, the first rectifying unit 20 may be a forward rectifying circuit. The synchronization signal may be a forward voltage outputted by the forward rectifying circuit.

Further, the second adapter may include a sampling and holding unit (corresponding to the above-mentioned sampling and holding unit 12). The sampling and holding unit includes a current sampling unit (corresponding to the above-mentioned current sampling unit 14) and a current holding unit (corresponding to the above-mentioned current holding unit 15).

In detail, as illustrated in FIG. 21, the current sampling unit includes a current detection resistor R3 and a galvanometer. The galvanometer detects the first current with the first pulsating waveform via the current detection resistor R3 to obtain a sampling current and converts the sampling current to a corresponding sampling voltage (the sampling voltage is configured to indicate the value of the first current with the first pulsating waveform).

The current holding unit includes voltage division resistors R4 and R5, and a capacitor C1. The current holding unit performs a voltage division on the sampling voltage outputted from an output port of the galvanometer via the voltage division resistors R4 and R5, and charges the capacitor C1 by utilizing voltage obtained after the voltage division, such that voltage across two ends of the capacitor C1 may vary depending on the first current with the first pulsating waveform. When the first pulsating waveform reaches a peak or a falling edge, the voltage across two ends of the capacitor C1 reaches a maximum value (corresponding to a peak value of the first current with the first pulsating waveform) and the sampling and holding unit enters the holding state.

Further, the second adapter includes a current collecting and controlling unit (corresponding to the above-mentioned current collecting and controlling unit 13). The current collecting and controlling unit may include an MCU (corresponding to the above-mentioned control unit), a comparing unit 24 and a discharging unit 16.

In detail, the comparing unit 24 may include a comparator. A first input end of the comparator is configured to receive the synchronization signal. A second input end of the comparator is configured to receive the reference voltage. In some embodiments, the first input end is configured as an in-phase input end, and the second input end is configured as an out-phase input end. In other embodiments, the first input end is configured as an out-phase input end, and the second input end is configured as an in-phase input end. The comparator sends a comparison result to the MCU.

The MCU determines when the first pulsating waveform is at peak or falling edge based on the comparison result of the comparator. When the first pulsating waveform is at peak or falling edge, it indicates that the sampling and holding circuit is in the holding stage. The MCU samples the voltage across two ends of the capacitor C1 via the ADC, to determine the peak value of the first current with the first pulsating waveform.

The discharging unit 16 may include a switch transistor Q3 and a resistor R6. After the MCU samples the peak value of the first current with the first pulsating waveform, the MCU controls the switch transistor Q3 to switch on. The capacitor C1 performs discharging on the resistor R6, to release electric charge at two ends of the capacitor C1. In this way, the voltage across two ends of the capacitor C1 may vary depending on the first current with the first pulsating waveform, thus it indicates that the sampling and holding unit is switched from the holding state to the sampling state.

Further, the second adapter may include a voltage adjusting unit (corresponding to the above-mentioned voltage adjusting unit 28). The voltage adjusting unit may include a voltage sampling unit (corresponding to the above-mentioned voltage sampling unit 29), a voltage comparing unit (corresponding to the above-mentioned voltage comparing unit 30) and a voltage control unit (corresponding to the above-mentioned voltage control unit 31).

In detail, as illustrated in FIG. 21, the voltage sampling unit includes a resistor R1 and a resistor R2, and is configured to perform voltage division on the output voltage of the second adapter to obtain the first voltage.

The voltage comparing unit includes an operational amplifier OPA. An out-phase input end of the OPA is configured to receive the first voltage. An in-phase input end of the OPA is coupled to the DAC, and configured to receive the first reference voltage provided by the DAC. The DAC is coupled to the MCU. The MCU may adjust the first reference voltage via the DAC, to adjust the output voltage and/or the output current of the second adapter.

The voltage control unit includes an optical coupling unit 40 and a PWM controller. An input end of the optical coupling unit 40 is coupled to an output end of the OPA. When an output voltage of the OPA is less than a working voltage VDD of the optical coupling unit 40, the optical coupling unit 40 starts to work, to provide feedback voltage to an FB end of the PWM controller. The PWM controller controls a duty ratio of the PWM signal outputted from the PWM end by comparing voltage at a CS end and voltage at the FB end. When the output voltage of the OPA is 0, the voltage at the FB end is stable. The duty ratio of the PWM control signal outputted from the PWM end of the PWM controller keeps constant. The PWM end of the PWM controller is coupled to the primary winding of the transformer T1 via the switch transistor Q2, and configured to the output voltage and the output current of the second adapter. When the duty ratio of the control signal sent from the PWM end is ascertained, the output voltage and the output current of the second adapter keep stable.

In addition, the MCU may further include a communication interface. A bidirectional communication can be performed with the device to be charged (such as the terminal) via the communication interface, to control the charging process of the second adapter. For example, the charging interface is a USB interface, and the communication interface may be a USB interface. In detail, the second adapter may use a power wire in the USB interface to charge the device to be charged (such as the terminal), and use a data wire (D+ and/or D−) in the USB interface to communicate with the device to be charged (such as the terminal).

In addition, the optical coupling unit 40 may be coupled to a voltage stabilizing unit, such that working voltage of the optical coupling unit keeps stable. As illustrated in FIG. 21, the voltage stabilizing unit in embodiments of the present disclosure may adopt a low dropout regulator (LDO).

The embodiment illustrated in FIG. 22 is similar to that illustrated in FIG. 21. The difference is that the voltage sampling unit formed of the resistors R1 and R2 illustrated in FIG. 21 may be replaced with a digital potentiometer (corresponding to the above-mentioned voltage division unit 34). An out-phase input end of the OPA is coupled to a second reference voltage, and the MCU adjusts the output voltage and the output current of the second adapter by adjusting a division ratio of the digital potentiometer. For example, if it is desired that the output voltage of the second adapter is 5V, the division ratio of the digital potentiometer is adjusted, such that voltage at an output end of the digital potentiometer is equal to the second reference voltage when the output voltage of the second adapter is 5V. Similarly, if it is desired that the output voltage of the second adapter is 3V, the division ratio of the digital potentiometer is adjusted, such that the voltage at an output end of the digital potentiometer is equal to the second reference voltage when the output voltage of the second adapter is 3V.

In embodiments illustrated in FIG. 21 and FIG. 22, the synchronization signal is obtained by rectifying with the first rectifying unit 20, which is not limited herein. The synchronization signal can also be obtained from the primary side of the second adapter, such as in an implementation illustrated in FIG. 9. The synchronization signal can also be obtained from the sampling and holding unit, such as from an output port of the galvanometer illustrated in FIG. 21 and FIG. 22.

In embodiments illustrated in FIG. 21 and FIG. 22, the comparing unit 24 directly compares the synchronization signal with the reference voltage, to determine whether the sampling and holding unit is in the holding state. However, the embodiments of the present disclosure are not limited thereto. By using an implementation illustrated in FIG. 13, the direct current signal in the synchronization signal is filtered out via the capacitor to obtain an alternating current signal at the zero-crossing point, and the alternating current signal at the zero-crossing point is compared with the reference voltage to determine whether the sampling and holding unit is in the holding state.

The control units indicated with different reference numerals may be control units dependent from each other, or may be a same control unit. In some embodiments, the second adapter includes an MCU. Each control unit herein may be the MCU.

The device embodiments of the present disclosure are described above in detail with reference to FIGS. 1-22. The method embodiments of the present disclosure will be described below in detail with reference to FIG. 23. It should be understood that, the description of method embodiments corresponds to the description of device embodiments, which are not elaborated herein for simplicity.

Figure 23:
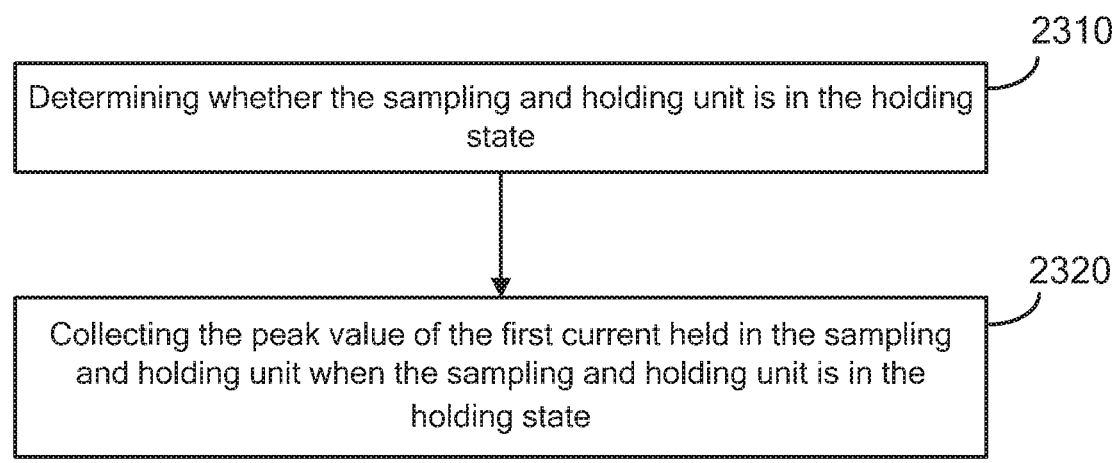
FIG. 23 is a flow chart illustrating a charging control method according to an embodiment of the present disclosure.

FIG. 23 is a flow chart of a charging control method according to embodiments of the present disclosure. The charging control method illustrated in FIG. 23 may be applied in the second adapter, such as the second adapter described in FIG. 1-FIG. 22. The second adapter may include a power conversion unit and a sampling and holding unit. The power conversion unit may be configured to convert input alternating current to obtain output voltage and output current of the second adapter. The output current of the adapter is first current with first pulsating waveform. The sampling and holding unit is coupled to the power conversion unit. When the power conversion unit is in a sampling state, the power conversion unit is configured to sample the first current. When the power conversion unit is in a holding state, the power conversion unit is configured to hold a peak value of the first current.

The charging control method illustrated in FIG. 23 may include the followings.

At block 2310, it is determined whether the sampling and holding unit is in the holding state.

At block 2320, the peak value of the first current held in the sampling and holding unit is sampled when it is determined that the sampling and holding unit is in the holding state.

In some embodiments, determining whether the sampling and holding unit is in the holding state may include: receiving a synchronization signal, in which a cycle of the synchronization signal is equal to 1/N of a cycle of the first pulsating waveform, where N is an integer greater than or equal to 1; and determining whether the sampling and holding unit is in the holding state according to the synchronization signal.

In some embodiments, receiving a synchronization signal may include: obtaining the synchronization signal from the power conversion unit.

In some embodiments, the power conversion unit includes a primary unit and a secondary unit. Obtaining the synchronization signal from the power conversion unit may include: obtaining the synchronization signal from the secondary unit.

In some embodiments, the secondary unit includes a first rectifying unit. The first rectifying unit is coupled to the current collecting and controlling unit. The first rectifying unit is configured to rectify the current coupled from the primary unit to the secondary unit to obtain second voltage with second pulsating waveform and to configure the second voltage with the second pulsating waveform as the synchronization signal, and to send the synchronization signal to the current collecting and controlling unit.

In some embodiments, the power conversion unit includes a primary unit and a secondary unit. Obtaining the synchronization signal from the power conversion unit may include: obtaining the synchronization signal from the primary unit.

In some embodiments, the primary unit is configured to rectify the alternating current to obtain third voltage with third pulsating waveform. The third pulsating waveform has the same cycle as the first pulsating waveform. The primary unit couples the third voltage from a primary side of the second adapter to a secondary side of the second adapter via an optical coupling unit to obtain fourth voltage with fourth pulsating waveform, configures the fourth voltage with the fourth pulsating waveform as the synchronization signal, and to send the synchronization signal to the current collecting and controlling unit.

In some embodiments, receiving a synchronization signal may include: obtaining the synchronization signal from the sampling and holding unit.

In some embodiments, the sampling and holding unit is configured to sample the first current with the first pulsating waveform to obtain a sampling current, to convert the sampling current to a sampling voltage, to configure the sampling voltage as the synchronization signal and to send the synchronization signal to the current collecting and controlling unit. The sampling voltage is configured to indicate a value of the first current with the first pulsating waveform.

In some embodiments, determining whether the sampling and holding unit is in the holding state according to the synchronization signal may include: determining whether the first pulsating waveform is at peak or falling edge according to the synchronization signal; and determining that the sampling and holding unit is in the holding state when the first pulsating waveform is at peak or falling edge.

In some embodiments, determining whether the first pulsating waveform is at peak or falling edge according to the synchronization signal may include: determining whether the first pulsating waveform is at peak or falling edge according to a comparison result between a voltage of the synchronization signal and a second reference voltage.

In some embodiments, determining whether the first pulsating waveform is at peak or falling edge according to the synchronization signal may include: filtering out a direct current signal in the synchronization signal to obtain an alternating signal at a zero-crossing point; comparing a voltage of the alternating signal with a reference voltage; and determining whether the first pulsating waveform is at peak or falling edge according to a comparison result between the voltage of the alternating signal and the reference voltage, in which a value of the reference voltage is 0.

In some embodiments, a cycle of the first pulsating waveform is equal to a cycle of the synchronization signal.

In some embodiments, the charging control method illustrated in FIG. 23 may further include: controlling the sampling and holding unit to switch from the holding state to the sampling state after the peak value of the first current with the first pulsating waveform is sampled.

In some embodiments, the sampling and holding unit includes a capacitor. The sampling and holding unit holds the peak value of the first current with the first pulsating waveform based on the capacitor in the sampling and holding unit. Controlling the sampling and holding unit to switch from the holding state to the sampling state may include: releasing electric charge at two ends of the capacitor in the sampling and holding unit such that the sampling and holding unit switches from the holding state to the sampling state.

In some embodiments, the second adapter may include a voltage adjusting unit. The voltage adjusting unit is coupled to the power conversion unit, and configured to detect and adjust the output voltage of the second adapter. The charging control method illustrated in FIG. 23 may further include: adjusting the peak value of the first current with the first pulsating waveform via the voltage adjusting unit.

In some embodiments, the voltage adjusting unit includes a voltage sampling unit, a voltage comparing unit, and a voltage control unit. The voltage sampling unit is coupled to the power conversion unit, and configured to sample the output voltage of the second adapter to obtain a first voltage. The voltage comparing unit has an input end coupled to the voltage sampling unit, and is configured to compare the first voltage and a first reference voltage. The voltage control unit has an input end coupled to an output end of the voltage comparing unit and an output end coupled to the power conversion unit, and is configured to control the output voltage of the second adapter according to a comparison result between the first voltage and the first reference voltage. Adjusting the peak value of the first current with the first pulsating waveform via the voltage adjusting unit may include: adjusting the peak value of the first current with the first pulsating waveform by adjusting a value of the first reference voltage.

In some embodiments, adjusting the peak value of the first current with the first pulsating waveform by adjusting a value of the first reference voltage may include: adjusting the value of the first reference voltage via a digital analogue converter so as to adjust the peak value of the first current with the first pulsating waveform.

In some embodiments, the voltage adjusting unit includes a voltage division unit, a voltage comparing unit and a voltage control unit. An input end of the voltage division unit is coupled to the power conversion unit. The voltage division unit is configured to perform voltage division on the output voltage of the second adapter according to a predetermined division ratio, to generate a second voltage. The voltage comparing unit has an input end coupled to an output end of the voltage division unit, and is configured to compare the second voltage with a second reference voltage. The voltage control unit has an output end coupled to the power conversion unit, and is configured to control the output voltage of the second adapter according to a comparison result between the second voltage and the second reference voltage. Adjusting the peak value of the first current with the first pulsating waveform via the voltage adjusting unit may include: adjusting the peak value of the first current with the first pulsating waveform by adjusting the division ratio.

In some embodiments, the voltage division unit includes a digital potentiometer. A high level end of the digital potentiometer is coupled to the power conversion unit. A low level end of the digital potentiometer is grounded. An output end of the digital potentiometer is coupled to the voltage comparing unit. Adjusting the peak value of the first current with the first pulsating waveform by adjusting the division ratio may include: adjusting the peak value of the first current with the first pulsating waveform by adjusting a division ratio of the digital potentiometer.

In some embodiments, the sampling and holding unit includes a current sampling unit, and a current holding unit. The current sampling unit is coupled to the power conversion unit, and configured to detect the first current to obtain a sampling current, and to convert the sampling current to a sampling voltage, in which the sampling voltage is configured to indicate a value of the first current. The current holding unit is coupled to the current sampling unit and the current collecting and controlling unit respectively, and configured to receive the sampling voltage from the current sampling unit and to charge a capacitor in the current holding unit based on the sampling voltage. Collecting the peak value of the first current with the first pulsating waveform held in the sampling and holding unit may include: obtaining the peak value of the first current with the first pulsating waveform by collecting voltage across the two ends of the capacitor in the sampling and holding unit (i.e. in the current holding unit).

In some embodiments, collecting the peak value of the first current with the first pulsating waveform held in the sampling and holding unit may include: collecting the peak value of the first current with the first pulsating waveform based on an analogue digital converter.

In some embodiments, the second adapter is configured to support a first charging mode and a second charging mode. A charging speed of the second adapter for the device to be charged in the second charging mode is greater than that of the second adapter for the device to be charged in the first charging mode. The first current with the first pulsating waveform is the output current of the second adapter in the second charging mode. The charging control method illustrated in FIG. 23 further includes: performing bidirectional communication with the device to be charged when the second adapter is coupled to the device to be charged, so as to control output of the second adapter in the second charging mode.

In some embodiments, performing the bidirectional communication with the device to be charged so as to control the output of the second adapter in the second charging mode may include: performing the bidirectional communication with the device to be charged to negotiate a charging mode between the second adapter and the device to be charged.

In some embodiments, performing the bidirectional communication with the device to be charged to negotiate the charging mode between the second adapter and the device to be charged may include: sending a first instruction to the device to be charged, in which the first instruction is configured to query the device to be charged whether to start the second charging mode; receiving a first reply instruction sent by the device to be charged, in which the first reply instruction is configured to indicate whether the device to be charged agrees to start the second charging mode; and charging the device to be charged in the second charging mode when the device to be charged agrees to start the second charging mode.

In some embodiments, performing the bidirectional communication with the device to be charged to control the output of the second adapter in the second charging mode may include: performing the bidirectional communication with the device to be charged to determine a charging voltage outputted by the second adapter in the second charging mode for charging the device to be charged; adjusting the output voltage of the second adapter such that the output voltage of the second adapter is equal to the charging voltage outputted by the second adapter in the second charging mode for charging the device to be charged.

In some embodiments, performing the bidirectional communication with the device to be charged to determine the charging voltage outputted by the second adapter in the second charging mode for charging the device to be charged may include: sending a second instruction to the device to be charged, in which the second instruction is configured to query whether the output voltage of the adapter is suitable for a present voltage of the battery; and receiving a second reply instruction sent by the device to be charged, in which the second reply instruction is configured to indicate that the output voltage of the second adapter is suitable, high or low.

In some embodiments, performing the bidirectional communication with the device to be charged to control the output of the second adapter in the second charging mode may include: performing the bidirectional communication with the device to be charged to determine a charging current outputted by the second adapter in the second charging mode for charging the device to be charged; adjusting the peak value of the first current with the first pulsating waveform such that the peak value of the first current with the first pulsating waveform is equal to the charging current outputted by the second adapter in the second charging mode for charging the device to be charged.

In some embodiments, performing the bidirectional communication with the device to be charged to determine the charging current outputted by the second adapter in the second charging mode for charging the device to be charged may include: sending a third instruction to the device to be charged, in which the third instruction is configured to query a maximum charging current supported by the device to be charged; receiving a third reply instruction sent by the device to be charged, in which the third reply instruction is configured to indicate the maximum charging current supported by the device to be charged; and determining the charging current configured to charge the device to be charged and outputted by the adapter in the second charging mode according to the maximum charging current supported by the device to be charged.

In some embodiments, performing the bidirectional communication with the device to be charged to control the output of the second adapter in the second charging mode may include: performing the bidirectional communication with the device to be charged to adjust the peak value of the first current with the first pulsating waveform, during a charging process of the second charging mode.

In some embodiments, performing the bidirectional communication with the device to be charged to adjust the peak value of the first current with the first pulsating waveform may include: sending a fourth instruction to the device to be charged, in which the fourth instruction is configured to query the current voltage of the battery in the device to be charged; receiving a fourth reply instruction sent by the device to be charged, in which the fourth reply instruction is configured to indicate the current voltage of the battery; and adjusting the peak value of the first current with the first pulsating waveform according to the current voltage of the battery.

In some embodiments, the second adapter includes a charging interface. The second adapter performs the bidirectional communication with the device to be charged via a data wire in the charging interface.

In some embodiments, the second adapter supports a first charging mode and a second charging mode. The first charging mode is a constant voltage mode. The second charging mode is a constant current mode. The first current with the first pulsating waveform is the output current of the second adapter in the second charging mode. The second adapter includes a control unit. The power conversion unit includes a primary filtering unit. The control unit is coupled to the primary filtering unit. The charging control method illustrated in FIG. 23 may further include: controlling the primary filtering unit to work in the first charging mode, such that a value of the output voltage of the second adapter is constant; controlling the primary filtering unit to stop working in the second charging mode, such that the output current of the second adapter is the first current with the first pulsating waveform.

In some embodiments, the second adapter directly applies the first current with the first pulsating waveform to two ends of the battery in the device to be charged for perform direct charging on the battery.

In some embodiments, the adapter is configured to charge a mobile terminal.

In some embodiments, the adapter further includes a control unit configured to control a charging process. The control unit may be a micro control unit.

In some embodiments, the adapter further includes a charging interface. The charging interface may be a universal serial bus interface.

It is to be understood that, the first adapter and the second adapter herein are for convenience of description only and are not intended to limit particular types of the adapter in the embodiments of the present disclosure.

Those skilled in the art may be aware that, in combination with the examples described in the embodiments disclosed in this specification, units and algorithm steps can be implemented by electronic hardware, or a combination of computer software and electronic hardware. In order to clearly illustrate interchangeability of the hardware and software, components and steps of each example are already described in the description according to the function commonalities. Whether the functions are executed by hardware or software depends on particular applications and design constraint conditions of the technical solutions. Persons skilled in the art may use different methods to implement the described functions for each particular application, but it should not be considered that the implementation goes beyond the scope of the present invention.

Those skilled in the art may be aware that, with respect to the working process of the system, the device and the unit, reference is made to the part of description of the method embodiment for simple and convenience, which are described herein.

In embodiments of the present disclosure, it should be understood that, the disclosed system, device and method may be implemented in other way. For example, embodiments of the described device are merely exemplary. The partition of units is merely a logical function partitioning. There may be other partitioning ways in practice. For example, several units or components may be integrated into another system, or some features may be ignored or not implemented. Further, the coupling between each other or directly coupling or communication connection may be implemented via some interfaces. The indirect coupling or communication connection may be implemented in electrical, mechanical or other manners.

In embodiments of the present disclosure, it should be understood that, the units illustrated as separate components can be or not be separated physically, and components described as units can be or not be physical units, i.e., can be located at one place, or can be distributed onto multiple network units. It is possible to select some or all of the units according to actual needs, for realizing the objective of embodiments of the present disclosure.

In addition, each functional unit in the present disclosure may be integrated in one progressing module, or each functional unit exists as an independent unit, or two or more functional units may be integrated in one module.

If the integrated module is embodied in software and sold or used as an independent product, it can be stored in the computer readable storage medium. Based on this, the technical solution of the present disclosure or a part making a contribution to the related art or a part of the technical solution may be embodied in a manner of software product. The computer software produce is stored in a storage medium, including some instructions for causing one computer device (such as a personal PC, a server, or a network device etc.) to execute all or some of steps of the method according to embodiments of the present disclosure. The above-mentioned storage medium may be a medium able to store program codes, such as, USB flash disk, mobile hard disk drive (mobile HDD), read-only memory (ROM), random-access memory (RAM), a magnetic tape, a floppy disc, an optical data storage device, and the like.

Although explanatory embodiments have been illustrated and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:
1. An adapter, comprising:
a power conversion unit, configured to convert input alternating current to obtain output voltage and output current of the adapter, in which the output current of the adapter is first current with first pulsating waveform;
a sampling and holding unit, coupled to the power conversion unit, and configured to sample the first current when the sampling and holding unit is in a sampling state, and to hold a peak value of the first current when the sampling and holding unit is in a holding state;

a current collecting and controlling unit, coupled to the sampling and holding unit, and configured to determine whether the sampling and holding unit is in the holding state, and to collect the peak value of the first current held in the sampling and holding unit when the sampling and holding unit is in the holding state; and a voltage adjusting unit, coupled to the power conversion unit, and configured to detect and adjust the output voltage of the adapter;

wherein the current collecting and controlling unit is coupled to the voltage adjusting unit, and configured to adjust the peak value of the first current via the voltage adjusting unit;

wherein the voltage adjusting unit comprises:

a voltage sampling unit, coupled to the power conversion unit, and configured to sample the output voltage of the adapter to obtain a first voltage;

a voltage comparing unit, having an input end coupled to the voltage sampling unit, and configured to compare the first voltage and a first reference voltage; and a voltage control unit, having an input end coupled to an output end of the voltage comparing unit, and an output end coupled to the power conversion unit, and configured to control the output voltage of the adapter according to a comparison result between the first voltage and the first reference voltage;

wherein the current collecting and controlling unit comprises a first control unit and a digital analogue converter; wherein an input end of the digital analogue converter is coupled to the first control unit, an output end of the digital analogue converter is coupled to the voltage comparing unit, and the first control unit is configured to adjust the value of the first reference voltage via the digital analogue converter so as to adjust the peak value of the first current.

2. The adapter according to claim 1, wherein the current collecting and controlling unit is configured to receive a synchronization signal, and to determine whether the sampling and holding unit is in the holding state according to the synchronization signal; wherein a cycle of the synchronization signal is equal to 1/N of a cycle of the first pulsating waveform, and the cycle of the first pulsating waveform is equal to the cycle of the synchronization signal, where N is an integer greater than or equal to 1.

3. The adapter according to claim 2, wherein the current collecting and controlling unit is configured to determine whether the first pulsating waveform is at peak or falling edge according to the synchronization signal, and to collect the peak value of the first current held in the sampling and holding unit when the first pulsating waveform is at peak or falling edge.

4. The adapter according to claim 3, wherein the current collecting and controlling unit comprises: a comparator and a second control unit; wherein a first input end of the comparator is configured to receive the synchronization signal, a second input end of the comparator is configured to receive a second reference voltage, the second control unit is coupled to an output end of the comparator and configured to determine whether the first pulsating waveform is at peak or falling edge according to a comparison result between a voltage of the synchronization signal and the second reference voltage.

5. The adapter according to claim 1, wherein the current collecting and controlling unit is further configured to control the sampling and holding unit to switch from the holding state to the sampling state when the peak value of the first current is collected.

6. The adapter according to claim 5, wherein the sampling and holding unit comprises a capacitor, and is configured to hold the peak value of the first current based on the capacitor in the sampling and holding unit;

the current collecting and controlling unit comprises a discharging unit and an additional control unit; wherein the discharging unit is coupled to the additional control unit and the capacitor in the sampling and holding unit respectively, and configured to discharge electric charge at two ends of the capacitor in the sampling and holding unit such that the sampling and holding unit switches from the holding state to the sampling state.

7. The adapter according to claim 1, wherein the sampling and holding unit comprises:

a current sampling unit, coupled to the power conversion unit, and configured to detect the first current to obtain a sampling current, and to convert the sampling current to a sampling voltage, in which the sampling voltage is configured to indicate a value of the first current; and a current holding unit, coupled to the current sampling unit and the current collecting and controlling unit respectively, and configured to receive the sampling voltage from the current sampling unit and to charge a capacitor in the current holding unit based on the sampling voltage;

wherein the current collecting and controlling unit is configured to collect the peak value of the first current by detecting voltage cross the two ends of the capacitor in the sampling and holding unit.

8. The adapter according to claim 1, wherein the adapter is configured to support a first charging mode and a second charging mode, a charging speed of the adapter for the device to be charged in the second charging mode is greater than that of the adapter for the device to be charged in the first charging mode, the first current is the output current of the adapter in the second charging mode; and the adapter comprises:

another control unit, configured to perform the bidirectional communication with the device to be charged when the adapter is coupled to the device to be charged, so as to control output of the adapter in the second charging mode.

9. A charging control method, applied in an adapter, the adapter comprising:

a power conversion unit, configured to convert input alternating current to obtain output voltage and output current of the adapter, in which the output current of the power adapter is first current with first pulsating waveform;

a sampling and holding unit, coupled to the power conversion unit, and configured to sample the first current when the sampling and holding unit is in a sampling state, and to hold a peak value of the first current when the sampling and holding unit is in a holding state; and a voltage adjusting unit, coupled to the power conversion unit and configured to detect and adjust the output voltage of the adapter;

wherein the voltage adjusting unit comprises:

a voltage sampling unit, coupled to the power conversion unit, and configured to sample the output voltage of the adapter to obtain a first voltage;

a voltage comparing unit, having an input end coupled to the voltage sampling unit, and configured to compare the first voltage and a first reference voltage; and a voltage control unit, having an input end coupled to an output end of the voltage comparing unit, and an output end coupled to the power conversion unit, and configured to control the output voltage of the adapter according to a comparison result between the first voltage and the first reference voltage;

and the method comprises:

determining whether the sampling and holding unit is in the holding state;

collecting the peak value of the first current held in the sampling and holding unit when the sampling and holding unit is in the holding state; and adjusting the value of the first reference voltage via a digital analogue converter so as to adjust the peak value of the first current.

10. The charging control method according to claim 9, wherein determining whether the sampling and holding unit is in the holding state comprises:

receiving a synchronization signal, wherein a cycle of the synchronization signal is equal to 1/N of a cycle of the first pulsating waveform and, the cycle of the first pulsating waveform is equal to the cycle of the synchronization signal, where N is an integer greater than or equal to 1; and determining whether the sampling and holding unit is in the holding state according to the synchronization signal.

11. The charging control method according to claim 10, wherein determining whether the sampling and holding unit is in the holding state according to the synchronization signal comprises:

determining whether the first pulsating waveform is at peak or falling edge according to the synchronization signal; and determining that the sampling and holding unit is in the holding state when the first pulsating waveform is at peak or falling edge.

12. The charging control method according to claim 11, wherein determining whether the first pulsating waveform is at peak or falling edge according to the synchronization signal comprises:

determining whether the first pulsating waveform is at peak or falling edge according to a comparison result between a voltage of the synchronization signal and a second reference voltage.

13. The charging control method according to claim 9, further comprising:

controlling the sampling and holding unit to switch from the holding state to the sampling state when the peak value of the first current is collected.

14. The charging control method according to claim 13, wherein the sampling and holding unit comprises a capacitor, and is configured to hold the peak value of the first current based on the capacitor in the sampling and holding unit;

and controlling the sampling and holding unit to switch from the holding state to the sampling state comprises:

releasing electric charge at two ends of the capacitor in the sampling and holding unit such that the sampling and holding unit switches from the holding state to the sampling state.

15. The charging control method according to claim 9, wherein the sampling and holding unit comprises:

a current sampling unit, coupled to the power conversion unit, configured to detect the first current to obtain a sampling current, and to convert the sampling current to a sampling voltage, in which the sampling voltage is configured to indicate a value of the first current; and a current holding unit, coupled to the current sampling unit and the current collecting and controlling unit respectively, and configured to receive the sampling voltage from the current sampling unit and to charge a capacitor in the current holding unit based on the sampling voltage;

and collecting the peak value of the first current held in the sampling and holding unit comprises:

obtaining the peak value of the first current by collecting a voltage cross the two ends of the capacitor in the sampling and holding unit.

16. The charging control method according to claim 9, wherein the adapter is configured to support a first charging mode and a second charging mode, a charging speed of the adapter for the device to be charged in the second charging mode is greater than that of the adapter for the device to be charged in the first charging mode, the first current is the output current of the adapter in the second charging mode;

and the charging control method comprises:

performing the bidirectional communication with the device to be charged when the adapter is coupled to the device to be charged, so as to control output of the adapter in the second charging mode.

\* \* \* \* \*